US012611828B2

(12) United States Patent
Sanli et al.

(10) Patent No.: US 12,611,828 B2
(45) Date of Patent: Apr. 28, 2026

(54) METHOD FOR PRODUCING AN XUV AND X-RAY DIFFRACTIVE OPTIC

(71) Applicant: Max-Planck-Gesellschaft zur Förderung der Wissenschaften e.V., Munich (DE)

(72) Inventors: Umut Tunca Sanli, Stuttgart (DE); Hakan Ceylan, Stuttgart (DE); Metin Sitti, Stuttgart (DE); Gisela Schütz, Stuttgart (DE); Kahraman Keskinbora, Stuttgart (DE)

(73) Assignee: MAX-PLANCK-GESELLSCHAFT ZUR FÖRDERUNG DER WISSENSCHAFTEN E.V., Munich (DE)

( * ) Notice: Subject to any disclaimer, the term of this patent is extended or adjusted under 35 U.S.C. 154(b) by 770 days.

(21) Appl. No.: 16/979,121

(22) PCT Filed: Feb. 15, 2019

(86) PCT No.: PCT/EP2019/053876
§ 371 (c)(1),
(2) Date: Sep. 8, 2020

(87) PCT Pub. No.: WO2019/170399
PCT Pub. Date: Sep. 12, 2019

(65) Prior Publication Data
US 2020/0398509 A1 Dec. 24, 2020

(30) Foreign Application Priority Data

Mar. 9, 2018 (EP) ..................................... 18161035
Jul. 9, 2018 (EP) ..................................... 18182355

(51) Int. Cl.
B29D 11/00 (2006.01)
G02B 5/18 (2006.01)
G03F 7/00 (2006.01)

(52) U.S. Cl.
CPC ...... B29D 11/00769 (2013.01); G02B 5/1857 (2013.01); G03F 7/0005 (2013.01)

(58) Field of Classification Search
None
See application file for complete search history.

(56) References Cited

U.S. PATENT DOCUMENTS 9,859,028 B2 1/2018 Schuetz et al.
2009/0284840 A1* 11/2009 DeVoe ..................... G02B 3/04
359/619

(Continued)

FOREIGN PATENT DOCUMENTS

JP 06094898 A * 4/1994

OTHER PUBLICATIONS

Gou et al. "Micro lens fabrication by means for femtosecond two photon polymerization", Opt. Express. , vol. 14(2) pp. 810-816 (Jan. 2006).*

(Continued)

*Primary Examiner* — Martin J Angebranndt
(74) *Attorney, Agent, or Firm* — LEYDIG, VOIT & MAYER, LTD.

(57) ABSTRACT

The present invention is directed to a method for printing a micro-scaled or nano-scaled XUV and/or X-ray Diffractive optic (1), including the following steps: a) providing a material (2) with a first component (2a) being photo-sensitive and being polymerizable by two-photon-absorption, b) providing data (3) of a desired geometrical structure (4) of the optic (1) and creating at least one trajectory (8) corresponding to the data (3) of the desired structure (4) of the (Continued)

optic (1), c) providing a high-intensity energy beam (5), in particular a laser beam, wherein the beam (5) comprises a focus (F) having a position being adjustable to a plurality of positions (F1, F2, <, Fp) being coincident with the at least one trajectory (8), d) polymerization of the material (2) by two-photon-absorption at a first position (Fn) of the focus (F), thereby creating a first voxel (vn1n2n3) of the structure (4) of the optic (1), adjusting the position of the focus (F) from the first position (Fn) to a subsequent position (Fn+1) of the focus (F) along the at least one trajectory (8) and repeating step d) at the subsequent position (Fn+1) of the focus (F), wherein a distance (d) between each of the positions (F1, F2, <, Fp) of the focus (F) and at least one of the rest of the positions (F1, F2, <, Fp) of the focus (F) is smaller than a mean diameter (vd) of the voxels produced at these positions with respect to their dimension parallel to the distance (d).

18 Claims, 13 Drawing Sheets

(56)                     References Cited

U.S. PATENT DOCUMENTS

| | | | |
|---|---|---|---|
| 2014/0003777 A1* | 1/2014 | Sengupta ................. | G02B 3/08 |
| | | | 427/508 |
| 2016/0046070 A1* | 2/2016 | Mappes ........... | B29D 11/00663 |
| | | | 264/482 |

OTHER PUBLICATIONS

Jiang et al., A two-photon femtosecond laser system for three dimensional microfabrication and data storage, Chin. Phys. Lett., vol. 20(12) pp. 2126-2129 (2003).*
Vila-Comamala et al., "Ultra-high resolution zone -doubled X-ray optics for the multi-KeV regime", Opt. Express, vol. 19(1) pp. 175-184 (Jan. 2011).*
Chung et al., "Micro-lens array fabrication by two photon polymerization technology", Intnl. J. Automation Smart Technol., vol. 3(2) pp. 131-135 (2013).*
Wu et al. "Hard X-ray zone plates: recent progress", Materials vol. 5 pp. 1752-1773 (2012).*
Wu et al., In-channel integration of designable microoptical devices using flat-scaffold-supported femtosecond-laser microfabrication for coupling-free optofluidic cell counting, Light:Sci.. & Applic., vol. 4 e228 (8 pages) (2015).*
Hu et al., "Additive manufacture of complex 3D Au-containing nanocomposites by simultaneous two-photo polymerization and photoreduction", Nature:ScientificReports vol. 7, Article 17150 (9 pages) (Dec. 2017).*
Sanli et al., "3D nanoprinted plastic kinoform X-ray optics", Adv. Mater. vol. 30 Article 1802503 (7 pages) (2018).*
Watanabe et al., "Fabrication of Fresnel Zone Plate embedded in silica glass by femtosecond laser pulses", Opt. Express., vol. 10(19) pp. 978-983 (Sep. 2002).*
Sanli et al., "3D nanoprinted plastic kinoform X-ray optics", Adv. Mater. vol. 30 Article 1802503 (7 pages) (2018) supporting information.*
Petrov et al., "Polymer X-ray refractive nano-lenses fabricated by additive technology", Opt. Express vol. 25(13) pp. 14173-14181 (Jun. 2017).*
Nishiguchi et al., "In-gel direct laser writing for 3D-Designed hydrogel composite that undergo complex self-shaping", Adv. Sci., vol. 5 articles 1700038 (7 pages) (copyright 2017, printed Jan. 2018).*
Saha et al. "Kinematric fixtures to enable multi-material printing and rapid non-destructive inspection during two-photon lithogra-
phy", Lawrence Livermore National Laboratory publication LLNL-JRNL-736107 23 pages (Aug. 2017).*
Bieda et al., "Two-photon polymerization of a branched hollow fiber structure with predefined circular holes", J. Photochem. Photobiol. A:Chem., vol. 319-320, pp. 1-7 (2016).*
Office Action issued in corresponding Chinese Patent Application No. 2019800180448, mailed Feb. 22, 2023.
Attwood (2000) Soft x-rays and extreme ultraviolet radiation: principles and applications, Cambridge Univ Press.
Ceylan et al. (Mar. 2017) "3D Chemical Patterning of Micromaterials for Encoded Functionality," Adv. Mater. 29(9): 1605072, pp. 1-7.
Evans-Lutterodt et al. (2003) "Single-element elliptical hard x-ray micro-optics," Opt. Express 11(8): 919-926.
Fabrizio et al. (1999) "High-efficiency multilevel zone plates for keV X-rays," Nature 401: 895-898.
Follath et al. (2010) "The X-ray microscopy beamline UE46-PGM2 at BESSY," AIP Cont. Proc. 1234(1): 323-326.
Frenzel et al. (Nov. 2017) "Three-dimensional mechanical metamaterials with a twist," Science 358(6366): 1072-1074.
Gissibl et al. (2016) "Two-photon direct laser writing of ultracompact multi-lens objectives," Nat. Photonics 10: 554-560.
Henke et al. (1993) "X-Ray Interactions: Photoabsorption, Scattering, Transmission, and Reflection at E=50-30,000 eV, Z=1-92," At. Data Nucl. Data Tables 54(2): 181-342 (uploaded in two parts).
Hohmann et al. (2015) "Three-Dimensional μPrinting: An Enabling Technology," Adv. Opt. Mater. 3(11): 1488-1507.
Jayne et al. (Mar. 2018) "Dynamic Actuation of Soft 3D Micromechanical Structures Using Micro-Electromechanical Systems (MEMS)," Adv. Mater. Technol. 3(3): 1700293, pp. 1-6.
Keskinbora et al. (2015) "Single-Step 3D Nanofabrication of Kinoform Optics via Gray-Scale Focused Ion Beam Lithography for Efficient X-Ray Focusing," Adv. Optical Mater. 3(6): 792-800.
Kirz (1974) "Phase zone plates for x rays and the extreme uv," J. Opt. Soc. Am. 64(3): 301-309.
Marchesini et al. (2016) "SHARP: a distributed GPU-based ptychographic solver," J. Appl. Crystallogr. 49: 1245-1252.
Mueller et al. (2014) "3D direct laser writing using a 405 nm diode laser," Opt. Lett. 39(24): 6847-6850.
Pfeiffer (Jan. 2018) "X-ray ptychography," Nat. Photonics 12: 9-17.
Richter et al. (Feb. 2017) "Guiding Cell Attachment in 3D Microscaffolds Selectively Functionalized with Two Distinct Adhesion Proteins," Adv. Mater. 29(5): 1604342, pp. 1-6.
Schift et al. (Jan. 2018) "Surface smoothening of the inherent roughness of micro-lenses fabricated with 2-photon lithography," Nanophotonics Australasia 2017 10456: 104561Z-1-104561Z-9.
Schneider et al. (2010) "Three-dimensional cellular ultrastructure resolved by X-ray microscopy," Nat. Methods 7(12): 985-987.
Schropp et al. (2012) "Hard x-ray scanning microscopy with coherent radiation: Beyond the resolution of conventional x-ray microscopes," Appl. Phys. Lett. 100(25): 253112-1-253112-3.
Shapiro et al. (2014) "Chemical composition mapping with nanometre resolution by soft X-ray microscopy," Nat. Photonics 8: 765-769.
Takeuchi et al. (2012) "Performance Test and Evaluation of Multilevel Fresnel Zone Plate with Three-Step Profile Fabricated with Electron-Beam Lithography," Jpn. J. Appl. Phys. 51(R2): 022502-1-022502-11.
Vila-Comamala et al. (2009) "Advanced thin film technology for ultrahigh resolution X-ray microscopy," Ultramicroscopy 109: 1360-1364.
Yabashi et al. (Jan. 2017) "The next ten years of X-ray science," Nat Photon 11: 12-14.
Chao et al. (2012) "Real space soft x-ray imaging at 10 nm spatial resolution," Opt. Express 20(9): 9777-9783.
European Search Report, dated Feb. 18, 2019, corresponding to European Patent Application No. 18182355, 2 pp.
International Search Report and Written Opinion, dated Apr. 25, 2019, corresponding to International Application No. PCT/EP2019/053876 (filed Feb. 15, 2019), 10 pp.
Lim et al. (2016) "Origin and hysteresis of lithium compositional spatiodynamics within battery primary particles," Science 353(6299): 566-571.

(56)　　　　　　　　References Cited

OTHER PUBLICATIONS

Maruo et al. (2009) "Single-anchor support and supercritical $CO_2$ drying enable high-precision microfabrication of three-dimensional structures," Optics Express 17(23): 20945-20951.

Ohmer et al. (2015) "Phase evolution in single-crystalline $LiFePO_4$ followed by in situ scanning X-ray microscopy of a micrometre-sized battery," Nat. Commun. 6: 6045, pp. 1-7.

Petrov et al. (Jun. 2017) "Polymer X-ray refractive nano-lenses fabricated by additive technology," Optics Express 25(13): 14173-14181.

Sakellari et al. (Aug. 2017) "3D Chiral Plasmonic Metamaterials Fabricated by Direct Laser Writing: The Twisted Omega Particle," Adv. Opt. Mater. 5(16): 1700200, 6 pp.

Seiboth et al. (Mar. 2017) "Perfect X-ray focusing via fitting corrective glasses to aberrated optics," Nat. Commun. 8: 14623, pp. 1-5.

Snigireva et al. (2001) "Holographic X-ray optical elements: transition between refraction and diffraction," Nucl. Instrum. Methods Phys. Res., Sect. A 467-468(Part 2): 982-985.

\* cited by examiner

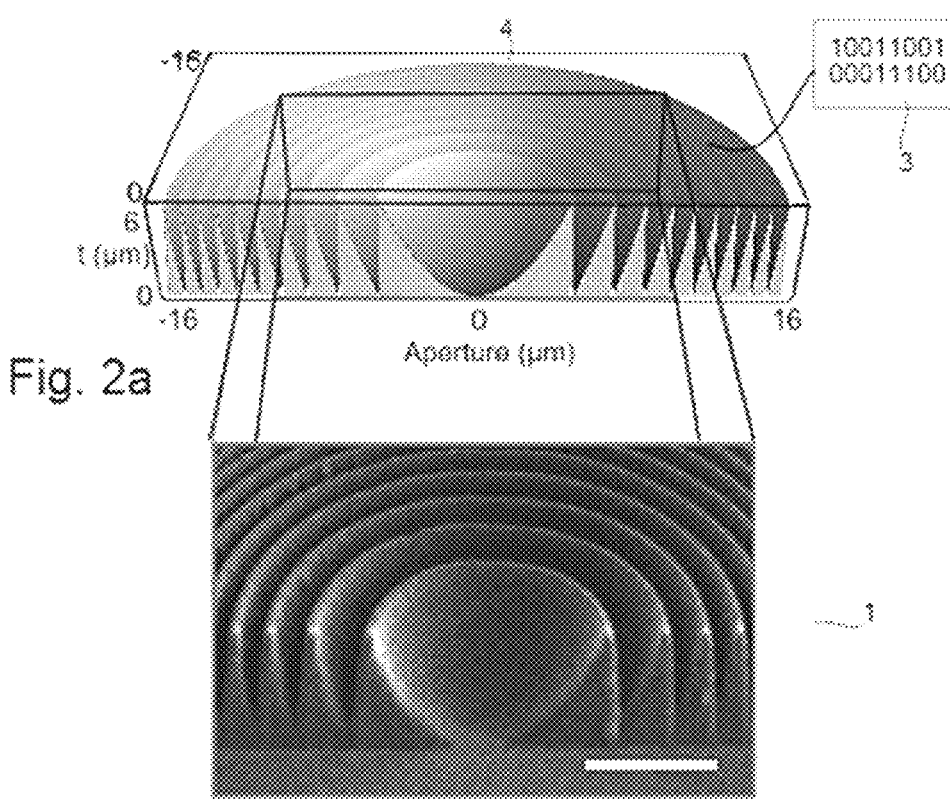
Fig. 2a
Fig. 2b
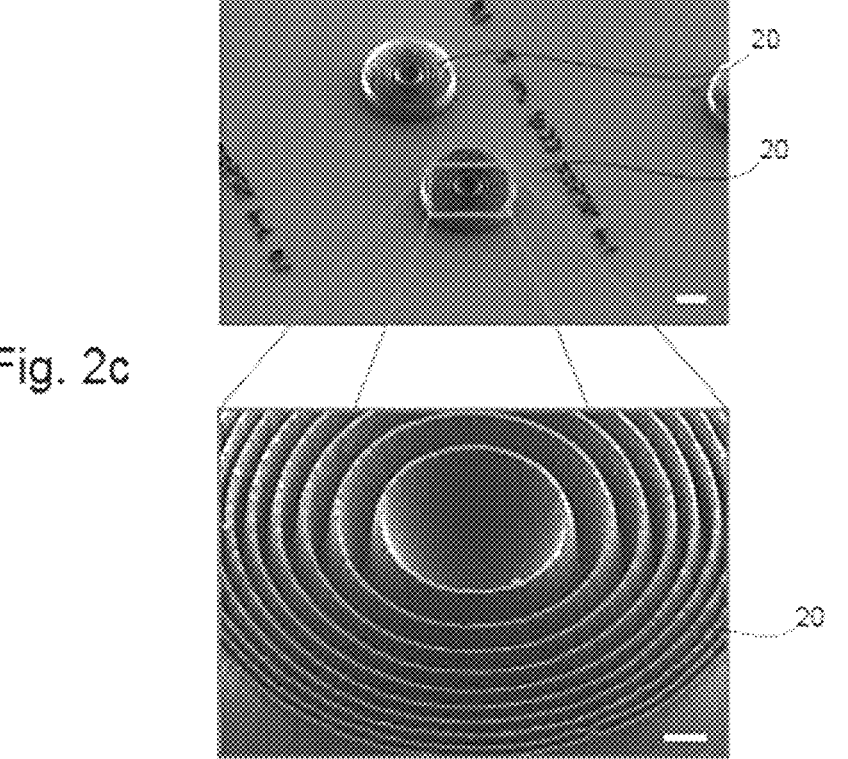
Fig. 2c
Fig. 2d

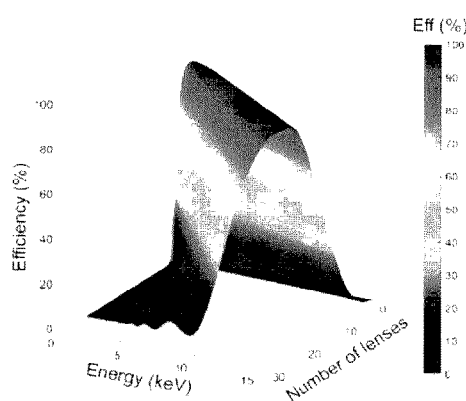
Fig. 8
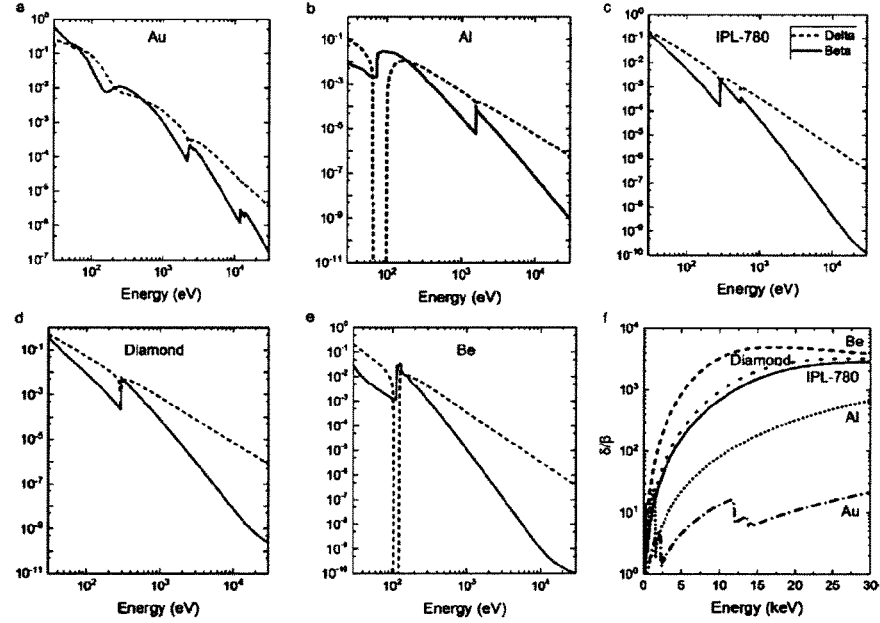
Fig. 9a-f
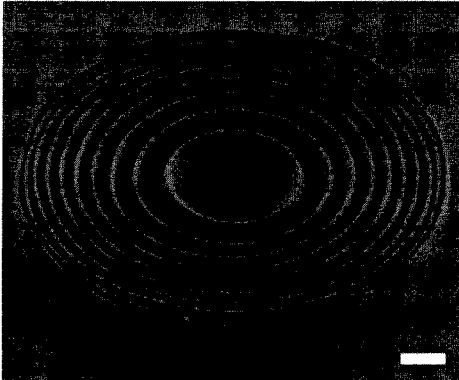
Fig. 10

METHOD FOR PRODUCING AN XUV AND X-RAY DIFFRACTIVE OPTIC

CROSS-REFERENCE TO RELATED APPLICATIONS

This application is a U.S. National Stage Application filed under 35 U.S.C. § 371 of International Application No. PCT/EP2019/053876, filed Feb. 15, 2019, which claims the benefit of European Application No. 18161035.3, filed Mar. 9, 2018, and 18182355.0, filed Jul. 9, 2018. All of these applications are hereby incorporated by reference in their entireties.

X-ray microscopy has been shown to be an important imaging technology. In the basic case, the resolution of a microscope is limited by the wavelength of the used radiation. In comparison to visible light, X-rays provide the advantage of a shorter wavelength of below 10 nm, allowing potentially higher resolutions.

Besides that, promising technologies use XUV ("extreme uv") rays with wavelengths between 10 nm and 121 nm. It should be noted that even if the examples cited in the following description are directed to X-ray optics, the object of the present invention is also applicable to XUV ray optics. Both expressions "optic" and "optics" are known from prior art.

High-performance focusing of X-rays requires the realization of very challenging three-dimensional (3D) geometries with micro- or nano-scale features, micron-scale apertures, and high aspect ratios. A particularly difficult structure is the profile of an ideal zone plate called a kinoform, which according to prior art has been manufactured in non-ideal approximated patterns, nonetheless required complicated multi-step fabrication processes.

The object of the present invention is to provide a novel concept in the 3D fabrication of X-ray optics, which enables in particular high-performance kinoforms to be rapidly manufactured with unprecedented aspect ratios. Furthermore, an extended concept shall be proposed for on-chip integration of various optics or X-ray optics.

The object is attained by a method for printing a micro-scaled or nano-scaled XUV and/or X-ray diffractive optic, including the following steps:

a) providing a material with a first component being photo-sensitive and being polymerizable by two-photon-absorption, b) providing data of a desired geometrical structure of the optic and creating at least one trajectory corresponding to the data of the desired structure of the optic, c) providing a high-intensity energy beam, in particular a laser beam, wherein the beam comprises a focus having a position being adjustable to a plurality of positions being coincident with the at least one trajectory, d) polymerization of the material by two-photon-absorption at a first position of the focus, thereby creating a first voxel of the structure of the optic, e) adjusting the position of the focus from the first position to a subsequent position of the focus along the at least one trajectory and repeating step d) at the subsequent position of the focus, wherein a distance between each of the positions of the focus and at least one of the rest of the positions of the focus is smaller than a mean diameter of the voxels produced at these positions with respect to their dimension parallel to the distance.

The expression "voxel" is known to be a combination of the words "volume" and "element". Analogously to the expression "pixel" for 2D-elements, it describes one element of the volume of the optic. The structure of the optic can be described as being divided into the plurality of voxels. Preferably, all voxels of the plurality of voxels are of identical shape and size. Approximately, a voxel can be considered as comprising the shape of a sphere having one diameter or of an ellipsoid having two different diameters.

The method preferably includes creating an intense focus, for example by a tightly focused high-power infrared laser, to promote non-linear absorption of photons in the central portion of a Gaussian focus causing a two-photon-polymerization (2PP) of the medium (for example, photoresist). This allows exposing features smaller than the wavelength. If the beam is activated, the focus exists. If the beam is not activated, there is no focus; thus, no polymerization occurs in this case. This allows for skipping specific regions of the material which are not to be polymerized. Thus, the distances between two positions being adjacent with respect to a direction of the trajectory do not necessarily have to be the same among each other.

Within the scope of the present invention, a specific position of the focus of the beam is preferably considered as corresponding to the position of one specific voxel of the structure of the optic.

It is possible to use a single beam emitted by a single beam source or more than one beam, each beam emitted by a separate beam source, to polymerize the material. More than one beam and/or beam source allows for simultaneous polymerization of more than one voxel, thus increasing production speed.

In a preferred variation of the method, at least one further high-intensity energy beam is provided, wherein the first and the at least one further high-intensity energy beam intersect each other in an intersecting volume within the material, wherein in the intersecting volume, a sum of energies provided by the first and the at least one further high-intensity energy beam exceeds a threshold value necessary for initiation of polymerization by two-photon-absorption. Using more than one beam could be advantageous to avoid creation of elliptically shaped voxels having a small lateral dimension and a (much) bigger axial-length. Since this anisometric voxels can result in limitations of the quality of the printed structures and result in a difference in printing resolution in xy- and z-directions, it has been found advantageous to avoid these anisometric voxels. It has been found that smaller and equiaxed voxels can be created by combining two or more (e. g. femtosecond) laser beams in a crossed geometry. Preferably, the intensities of the individual beams are adjusted in such that the individual focal intensities approach but do not overcome the power threshold required for 2PP to initiate. Thus, only in the volume where the two beams are crossing each other, the focal intensity overcomes the 2PP threshold. Polymerization thus only occurs in the volume where the two elliptical volumes of the two beams intersect. The beams can cross each other at any suitable angle. Angles between 5 and 355° have been found to be suitable to avoid the above-mentioned elliptically shaped voxels having a small lateral dimension and a (much) bigger axial-length. More preferably the beams cross each other in an angle between 15 and 75°, more preferably between 25 and 65°. This allows the beam source to be spaced apart from each other. Preferably, two beams cross each other at right angles. At this angle, voxels having the same lateral dimension as axial-length (with respect to the beam direction(s)) can be created. However, more than two beams and different angles between these beams can be used to adapt the voxel shape and size to specific requirements.

By adapting the voxel shape and size to specific requirements significant improvements of the resolution of the 2PP could be improved axially and laterally. The preferred embodiment of two beams cross each other at right angles already provides a significant improvement of the voxel shape and size. The resulting intersection has a geometrical shape similar to two cylinders intersecting at right angles, which is called a Steinmetz solid or a bicylinder. This solid has a smaller volume than a single ellipse and is quasi-isometric. This embodiment allows printing of high quality parts with even higher resolution at the nanoscale with isometric resolution. It has been shown that the isometric resolution further improves the quality of printed optic.

In a preferred embodiment, foci of two or more beams are overlapped with any overlap factor, running parallel or perpendicular to each other or in oblique angles, in order to engineer size and shape of the interaction volume. In another embodiment, each foci can be in any of the desired shape. In each these embodiments, preferably only the overlapped volume must overcome the 2PP intensity threshold.

Preferably, the position of the focus is successively adjusted up to a last position of the focus, thereby creating a plurality of voxels of the structure of the optic by repeating steps d) and e) at every position of the focus. It is preferred that after creating the plurality of single voxels, the structure of the optic is completed. Thus, preferably each and every voxel of the structure of the optic is produced. Directly after the polymerization of the material at the last position of the focus has been finished, it is preferred that the optic is directly shaped into one single piece. Thus, it is preferred that a post-process-step like fusing single polymerized regions together to form the optic is omitted.

By keeping the distance between the position of the focus corresponding to an arbitrary voxel (e.g. the first voxel as mentioned above or any other voxel) and at least one of the rest of the positions of the focus smaller than a mean diameter of the voxels produced at these positions with respect to their dimension parallel to the distance, it is achieved that the arbitrary voxel overlaps with respect to at least one dimension with at least one of the other voxels. This other voxel can be a voxel which has already been created in advance to the respective voxel (except for the first voxel) or it can be a voxel which is created after the respective voxel.

Since the surface and internal roughness is critical in application of XUV ray and X-ray focusing, it is preferred that the overlap between two voxels is very strong. In particular, a well defined surface with a roughness of sub-10 nm is desired. This way post-processing steps such as thermal re-flow can be avoided. It is preferred that the ratio between the distance between each of the positions of the focus and at least one of the rest of the positions of the focus and the mean diameter of the voxels produced at these positions with respect to their dimension parallel to the distance comprises a value of between smaller than 0.9, preferably of smaller than 0.7, more preferably of smaller than 0.5 and most preferably of smaller than 0.3.

It is even preferred that a distance between the position of the focus corresponding to the respective voxel and two, three, four, five or six of the rest of the positions of the focus is smaller than a mean diameter of the voxels produced at these positions with respect to their dimension parallel to the distance. Thus, a two- or even three-dimensional overlap is achieved with one or two overlaps in each dimension, wherein one overlap refers to the relative position of two voxels.

The advantage of such overlap is that heating of the voxels after finishing polymerization, especially above the glass transition temperature is not necessary. In this case, heating could be detrimental to the structural quality of the optic as control of the geometry during the thermal reflow process is hard to guarantee. Hence, this extra process step of heating is not desired according to the present invention, where the structural infidelities are extremely intolerable. Instead, it is preferred that directly after polymerization has finished, each one of the single voxels comprises a coherent connection to at least another one, preferably more than one, more preferably at least two, even more preferably at least three of the single voxels.

According to a preferred embodiment, the material comprises a second component having a higher electron density than the first component, wherein the second component preferably is a metal salt and/or comprises nano particles. By increasing the electron density, it is possible to achieve a specified value of the refractive index of the printed optic. Thus, the properties of the optic concerning refraction $(1-\delta)$ and absorption ($\beta$) values can be tailored with respect to a given XUV ray and/or X-ray energy range.

The amount of the second component of the material has to be chosen to not disturb the polymerization of the first component of the material.

Two-photon absorption is the absorption of two photons of identical or different frequencies in order to excite a molecule from a first energy electronic state to a second higher energy electronic state. The energy difference between the first and the second states of the molecule equals the sum of the photon energies of the two photons. Two-photon absorption is a second-order process, several orders of magnitude weaker than linear absorption at low light intensities. It differs from linear absorption in that the atomic transition rate due to two-photon absorption depends on the square of the light intensity, thus it is a nonlinear optical process, and can dominate over linear absorption at high intensities. Two-photon absorption can be used to initiate photo-polymerization on a precise microscopic scale in 3D. 2PP uses non-linear absorption of the photons from a laser, preferably an intense femtosecond infrared (IR) laser, to create a sub-wavelength interaction volume, preferably between 200 and 10 nm, and more preferably between 80 to 50 nm.

A beam, in particular a laser beam, can be focused at a desired position in the material, preferably a polymer precursor or a photo finish. Then an initiator in the precursor is excited by two-photon absorption, photoactivating the polymerization or cross-linking in the material at the single voxel. This process is confined to the vicinity of the excitation volume (voxel). When the (laser) beam is moved to a different position, the polymerization or cross-linking is initiated in the new location. Finally, if there are non-crosslinked portions (those that have not been exposed to the laser beam), they can be removed, preferably by developing in an organic solution, for example in propylene glycol monomethyl ether acetate and isopropanol.

In the present method, the photo-sensitive material is polymerized along computer-controlled trajectories, which are preferably generated based on the computer-aided design (CAD) file of the desired structure.

It is possible to build the element successively following any direction, for example in a direction which equals the axial direction of the resulting element, the radial direction of the resulting element and/or the height direction of the resulting element.

According to a preferred embodiment, the geometrical structure of the optic is described having cartesian or polar coordinates, wherein the plurality of voxels is created in multiple successive steps, wherein in each one of the successive steps, the position of the focus of the beam comprises a constant value with respect to a first one of the coordinates throughout the whole step.

By guiding the focus of the beam as described, the optic can be produced slice after slice, wherein every constant value of the first coordinate corresponding to a specific step belongs to a different slice. Depending on the type of the coordinate, the slices can for example be in form of a cuboid having a height of a single voxel or in form of a circular disc having a height of a single voxel or in form of a right circular cylinder or a hollow right circular cylinder having a wall thickness of a single voxel.

Furthermore, it is preferred that each of the successive steps is assigned to a different constant value with respect to the first one of the coordinates, the constant value preferably successively increasing or successively decreasing starting from a first of the successive steps to a last one) of the successive steps.

Thus, the focus preferably does not return to a position corresponding to a specific constant value of the first coordinate once it has finished the corresponding step and has moved to another specific constant value of the first coordinate, thus starting the next successive step. Furthermore, it is preferred that the focus performs a movement with respect to the first coordinate which is a one-direction movement. Thus, it is preferred that directly after one specific slice has been finished, the slice corresponding to a position located adjacent to the specific slice is produced. Furthermore, it is preferred that the first of the successive steps starts in a position with respect to the first coordinate which represents the position proximate to a beam source emitting the beam.

According to another preferred embodiment of the invention, it is preferred that each of the successive steps is divided into multiple successive step portions, wherein in each one of the step portions, the position of the focus of the beam comprises a constant value with respect to a second one of the coordinates throughout the whole step portion.

By guiding the focus of the beam as described, the optic can be produced line after line within one specific slice, wherein every constant value of the second coordinate corresponding to a specific step portion belongs to a different line. Depending on the type of the second coordinate, the lines are understood to be in form of a straight line or in form of circle.

Furthermore, it is preferred that each of the successive step portions belonging to one of the successive steps is assigned to a different constant value with respect to the second one of the coordinates, the constant value preferably successively increasing or successively decreasing starting from a first of the successive step portions of the successive step portions.

Thus, the focus preferably does not return to a position corresponding to a specific constant value of the second coordinate once it has finished the corresponding step portion and has moved to another specific constant value of the second coordinate, thus starting the next successive step portion. Furthermore, it is preferred that the focus performs a movement with respect to the second coordinate which is a one-direction movement. Thus, it is preferred that directly after one specific line has been finished, the line corresponding to a position located adjacent to the specific line is produced. The explanations outlined above refer to second coordinates and lines corresponding to a specific constant value of the first coordinate.

It is possible that the optic is a single optic selected from the group comprising a kinoform, a zone plate, a lens or a nano-focusing lens having a cylindrical, spherical, parabolic, elliptic, achromatic or holographic geometry, a wavefront shaping element such as a wavefront shaping plate, an aberration corrector, a wavefront corrector, an achromatic element, a phase plate optic or a free-form optic. It is also possible that the optic is a stack or an array of more than one of any of these single optics.

It is conceivable that more than one and preferably all single optics of the stack or array of more than one of any of these single optics are printed directly in succession, in particular without any intermediate step. In general, if single optics are to be produced within a stack of optics, it is preferred that the laser beam is not guided through optics which printing process has already been finished. Thus, the laser beam is preferably not affected by the already printed optical element(s) on its way to the focus point.

It could be possible that all elements of the stack or of the array are kinoforms. This could be used for high efficiency focusing of hard and soft X-rays.

Furthermore, it could be possible that all elements of the stack or of the array are phase plates. This allows generation of X-ray vortices with extremely high topological charges, c, with C=N×c, where C is the total topological charge and N the number of stacked phase plates. Single optics with charges larger than 20 were not shown in literature due to difficulties in fabrication. The present invention allows generation of X-ray vortices with topological charges c of more than 15, preferably more than 20, more preferably more than 25 and most preferably even more than 30.

Furthermore, it could be possible that the elements of the stack or of the array represent any combination of focusing elements, aberration correction elements and/or vortex generator elements.

According to a preferred embodiment, the optic is a kinoform comprising a geometrical profile being calculated according to the following equations:

$$t(r) = \text{Mod}[(r/F)^2, 1], \tag{1}$$

$$F = B\sqrt{\frac{f}{E}}, \tag{2}$$

where t(r) is a height of the kinoform as a function of its radius r, Mod is a modulo function where 1 is the dividend, F (μm) is a parameter which depends on a focal length f and on an operating energy of the kinoform and on an constant B, wherein the constant B preferably has a value between 45 and 55, in particular a value of 49.8.

Since the optic can be described as having cartesian coordinates with three main directions x, y and z being perpendicular towards each other, it is conceivable that the optic can be printed following any of these directions. In particular, if the single optic comprises a central axis wherein at least a part of the optic is rotationally symmetrical to this central axis (like a kinoform), and the central axis being parallel to direction z, one could imagine that the optic is printed following the direction z (vertically) or any of directions x and y (horizontally).

Furthermore, it is preferred that the optic is dried by critical point drying after step e) has finished. The method of critical point drying is known to preserve sample morphology, for example of biological specimens. At the critical point of a medium, physical characteristics of liquid and gaseous phase of this medium are not distinguishable. Compounds which are in the critical point can be converted into the liquid or gaseous phase without crossing the interfaces between liquid and gaseous avoiding the damaging effects. Thus, this embodiment of the invention reduces the risk that the optic is damaged e.g. during evaporation of the solvent. This results in lower scrap rates. If water is to be removed (dehydration of the samples) by critical point drying, it is to be considered that the critical point of water lies at 374° C. and 229 bar where any biological sample would be destroyed. To overcome this problem, water can be replaced against a transitional fluid, for example liquid carbon dioxide ($CO_2$), whose critical point lies at 31° C. and 74 bar and is more appropriate for all biological applications and technically relative easy to maintain. However, $CO_2$ is not miscible with water. Therefore, water has to be replaced by exchange fluids (like ethanol or acetone) which are miscible in both the medium and the transitional fluid. If the exchange fluid cannot be used for critical point drying due to its high critical point temperature and/or pressure, the medium to be removed is first replaced with the exchange fluid in a pre-critical point drying step. Then, this exchange fluid is replaced with the transitional fluid which is brought to its critical point and converted to the gaseous phase by decreasing the pressure at constant critical point temperature.

Preferably, the voxels are created such that except for a first one, every single voxel is created adjacent to at least one existing voxel, preferably forming a coherent connection to the at least one adjacent existing voxel. Thus, a specific position of the focus of the beam is preferably located at a voxel adjacent to at least one specific position.

In order to render the method as time efficient as possible, it is preferred that the plurality of voxels is created by adjusting the position of the focus of the beam to move along a single continuous trajectory.

According to another preferred embodiment, it is possible that the plurality of voxels is created by adjusting the position of the focus of the beam to move along a plurality of continuous trajectories. For example, the beam and its focus are both deactivated in so called idle sections, thus, the continuous trajectory is divided into the plurality of continuous trajectories separated by idle sections. In this case, one single continuous trajectory preferably corresponds to one single successive step or to one single successive step portion. Furthermore, it is possible that the last position of the focus belonging to a first continuous trajectory equals a position directly adjacent to the first position of the focus belonging to a second continuous trajectory. Adjacent means that the first position of the focus belonging to the second continuous trajectory preferably comprises the same distance towards the last position of the focus belonging to the first continuous trajectory as the position of the focus belonging to the first continuous trajectory prior to the last position. It is also possible that the last position of the focus belonging to a first continuous trajectory is not adjacent to the first position of the focus belonging to a second continuous trajectory and/or differs from said first position with respect to the first, the second and/or the third coordinate.

It is preferred that the position of the focus is adjusted by moving the material directly or indirectly or by adjusting a deflection of the beam.

Furthermore, it is preferred that the beam is emitted by a beam source following a beam direction extending towards the material, wherein a first substrate being transparent to the beam and a second substrate being transparent to the beam and having an aperture are provided, wherein a first side of the second substrate is placed on the first substrate, wherein a first side of a membrane being XUV ray and/or X-ray transparent, preferably a silicon nitride membrane, is placed on a second side of the second substrate opposite from the first side, and wherein the material is placed within the aperture of the second substrate and/or on a second side of the membrane opposite from the first side, wherein the beam source is arranged on a first side of the first substrate opposite from the second substrate or on the second side of the membrane.

Preferably a further beam source is provided such that the beam of the first beam source and a beam of the further beam source are running towards or perpendicular to each other. The further beam(s) can be used to accelerate production of the desired optics (e. g. by initiation polymerization ad more than only one position) and/or (as described above) amend the shape of the voxels.

Due to the membrane being XUV ray and/or X-ray transparent, it is not necessary to remove the membrane before putting the optic into their intended use. Instead, the membrane provides mechanical stability to the optic during use.

The first substrate preferably is a glass slice. Independently therefrom, the second substrate preferably is a suitable carrier frame, in particular a silicon frame.

If the polymerizable material is placed within the aperture of the second substrate, it is placed on the first side of the membrane. In this case, the aperture provides mechanical limitation to the material.

If high aspect ratios are to be achieved, it is preferred that the beam first is guided through the material before being guided through the first substrate, in order to avoid any diffraction of the beam caused by the first substrate. In this case, the material is placed between the first substrate and the beam source, thus, the beam source is arranged on the first side of the first substrate opposite from the second substrate.

One can imagine that the beam follows a vertical or a horizontal direction, wherein the vertical direction complies with the direction of gravity force. It is conceivable that the optic is printed following the vertical direction downwards (thus, the direction of gravity force), which is referred to as printing "a hanging optic", or upwards (thus, counter to the direction of gravity force), which is referred to as printing "a standing optic". Even though the density of the polymerized regions is higher with respect to the non-polymerized polymer solution, it has been found that the surface tension at the interface between the polymerized regions and the polymer solution is high enough to avoid the polymerized regions altering their position within the polymer solution. Nevertheless, it is conceivable to dope the polymer solution with high electron density materials and to apply an electrical field in order to maintain the particles together with the polymer solution in place.

If the material is placed on both sides of the membrane, a double sided optic, e.g. a double sided kinoform, can be printed at once on both sides of the membrane, doubling the aspect ratio without complicating the fabrication process. This would allow printing a first optic on the first side and a second optic on the second side of the membrane successively or even simultaneously for maximum alignment accuracy and fabrication speed. Of course, the membrane together with the double-sided optic can be used afterwards.

According to a preferred embodiment, an adhesion promoter is placed between the membrane and the material. This is done prior to printing and helps that the printed optic does not delaminate from the membrane. The adhesion promoter preferably is a thin layer of organic molecule such as 3-(trimethoxysilyl)propyl or a self-assembled monolayer, etc. that does not significantly absorb incident X-rays.

In order to reduce refraction, it is preferred that the beam is guided through immersion oil preferably being placed within the aperture of the second support and/or on a side of the first substrate being directed towards the beam source. For achieving double-sided printing as outlined above, the immersion oil on the bottom side of the silicon frame of course must be replaced by the material. This arrangement is illustrated by FIG. 7 (see detailed description below).

One could easily imagine that the method as described is also used for printing a mold for an optic, preferably for a micro-scaled or nano-scaled XUV and/or X-ray Diffractive optic. The mold preferably comprises a shape being complementary to the shape of the desired optic. After printing the mold, it can for example be filled directly or by depositing a desired material like metals, semiconductors, oxides or nitrides, preferably by Atomic layer deposition (ALD). It is conceivable that the shape of the mold at the position of sharp edges is regained by removing the atoms being placed by ALD on the very tip of the sharp edge. It is also possible to first place a thin metal layer using ALD which layer is then used as a plating base for an electro-plating process, wherein the same or a different metal can be used to fill the mold. It is conceivable that the mold is removed after filling with the material for the optic. In this case a planarization process can be utilized to remove the extraneous material as a result of the filling process, for example a standard planarization process such as chemical mechanical polishing or reactive ion etching. However, it is also conceivable that the mold is not removed after filling but maintains as a mechanical support for the optic.

Thus, the object of the present invention is also attained by a method for producing a microscaled or nano-scaled XUV and/or X-ray Diffractive optic, including the following steps:

a) providing a material with a first component being photo-sensitive and being polymerizable by two-photon-absorption, b) providing data of a desired geometrical structure of a mold of the optic and creating at least one trajectory corresponding to the data of the desired structure of the mold, c) providing a high-intensity energy beam, in particular a laser beam, wherein the beam comprises a focus having a position being adjustable to a plurality of positions being coincident with the at least one trajectory, d) polymerization of the material by two-photon-absorption at a first position of the focus, thereby creating a first voxel of the structure of the mold, e) adjusting the position of the focus from the first position to a subsequent position of the focus along the at least one trajectory and repeating step d) at the subsequent position of the focus, wherein a distance between each of the positions of the focus and at least one of the rest of the positions of the focus is smaller than a mean diameter of the voxels produced at these positions with respect to their dimension parallel to the distance, f) filling the mold with a second material, preferably by atomic layer deposition, thereby creating a desired structure of the optic.

After step f), it is conceivable that a planarization process is utilized to remove the extraneous material as a result of the filling process of step f). This can be achieved by using standard planarization processes as described above.

Preferably, in step c) more than only one high-intensity energy beam is provided. The plurality of high-intensity energy beam can ab arranged in parallel, perpendicular and/or oblique angles. It is possible to use more than one high-intensity energy beam, each beam emitted by a separate beam source, to polymerize the material. More than one beam and/or beam source allows for simultaneous polymerization of more than one voxel, thus increasing production speed.

However, in a preferred variation of the method, the first and the at least one further high-intensity energy beam intersect each other in an intersecting volume within the material, wherein in the intersecting volume, a sum of energies provided by the first and the at least one further high-intensity energy beam exceeds a threshold value necessary for initiation of polymerization by two-photon-absorption. As described above with respect to the direct printing of micro-scaled or nano-scaled XUV and/or X-ray diffractive optics, using more than one beam could be advantageous to adjust the shape of voxels to specific needs. While 2PP initiated by only one single high-intensity energy beam usually results in elliptically shaped voxels having a small lateral dimension and a (much) bigger axial-length, these anisometric voxels resulting in limitations of the quality of the printed structures and different printing resolution in xy- and z-directions could be avoided by using more than one high-intensity energy beam. Smaller and more equiaxed voxels can be created by combining two or more (e. g. femtosecond) laser beams in a intersecting (e. g. crossing) geometry. Preferably, the intensities of the individual beams are adjusted in such that the individual focal intensities approach but do not overcome the power threshold required for 2PP to initiate. Thus, only in the volume where the two beams are crossing each other, the focal intensity overcomes the 2PP threshold. Polymerization thus only occurs in the volume where the two elliptical volumes of the two beams intersect.

Depending on the desired structure of a voxel and/or the number of available high-intensity energy beam sources, the angle between the at least two beams can be selected. Angles between 5 and 355°, preferably between 15 and 75°, more preferably between 25 and 65° have been found to be suitable. Preferably, two beams cross each other at right angles, since this geometry allows a small intersecting volume with a small number of beams. This angle further provides the advantage that the created voxels have the same lateral dimension as axial-length, which is advantageous for most 3D-structures. However, more than two beams and different angles between these beams can be used to adapt the voxel shape and size to specific requirements. By adapting the voxel shape and size to specific requirements significant improvements of the resolution of the 2PP could be improved axially and laterally.

In an preferred embodiment two or more beams are laser beams. It has been found that laser beams are especially suitable since their intensity can be adapted to specific needs very easily. Thus, it can be ensured that the energy threshold required for 2PP to initiate is only overcome in the volume in which all lasers intersects each other. This allows generation of very small voxels (preferably of a desired shape).

Since the present method allows for printing overhang structures, one can envisage printing FZPs with tilted or wedged zones. For a tilted FZP, all the zones are tilted to a single angle, usually calculated to satisfy the Bragg condition for the outermost zone. For a wedged or ideal FZP all the individual zones with thickness $d_i$ are tilted to the angle $\theta_i$ satisfying the Bragg condition. Especially the Wedged-FZP structure can only be approximated with conventional fabrication techniques. With 3D printing, it can be realized in its ideal form. A similar fabrication strategy can be envisaged for curved-FZPs as well.

The Bragg condition describes the relationship between the scattering angle $\theta$ where constructive interference occurs, the interplanar distance d of a crystalline solid and the wavelength $\lambda$ of the incident wave. The Bragg condition describes: $n \cdot A = 2 \cdot d \cdot \sin(\theta)$. If the Bragg condition is satisfied, constructive interference occurs.

The present invention features structures having submicron scale features, which require extra finesse in handling during development. The lenses produced are designed to focus XUV rays and X-rays, preferably having a concave curvature. The present invention features lenses being both diffractive and refractive due to the small feature size as well as short-wavelength radiation they are designed for.

The present invention describes for the first time:

3D nano-printing with isometric 2PP resolution.

3D printing (additive manufacturing) of high-efficiency kinoforms.

Horizontal stacking of kinoform optics and their integration with other optics for higher energies. Vertical Stacking of lenses can also be implemented.

3D printing of all these elements on MEMS devices that would allow realizing miniaturized zoom lenses for X-rays, and arbitrary manipulation of wavefronts by inserting and removing optics in groups or as individual elements.

Structures can be printed directly on the moving parts of such MEMS devices.

Such a device can combine stationary and moving elements to directly change the working energy of the lenses as well.

Integration of various optical components would allow putting all components necessary for a microscope to be located on a chip. We call this approach "microscope-on-a-chip" and this would be cheap solution for certain applications.

The present invention overcomes the following deficits known from prior art:

The parabolic surface profile of Kinoform lenses is very challenging to fabricate as was the topic of patent U.S. Pat. No. 9,859,028 B2. In that patent a subtractive manufacturing method was used which has a fundamental limit in the achievable aspect ratio due to the nature of the nanofabrication method utilized (IBL). Now, by using 2PP based femtosecond laser lithography it can be achieved an incredibly high aspect ratio which is beyond the capability of any other lithographic (subtractive) approach in a single fabrication step.

Virtually unlimited aspect ratio with sub-micron features in an ultra-fast, single step fabrication method can be achieved.

It is shown for the first time that Kinoform type X-ray optics with high aspect ratios can be fabricated using 3D printing in an incredibly fast process of less than 1 minute per lens. The X-ray optical properties of the used polymers are outstanding. The fabrication method allows for essentially, unlimited aspect ratios, and can be used to focus X-rays of very high energies as well.

It is shown that 3D printing allows for horizontal on-chip stacking of different kinds of optics. Various optical systems can be designed and printed also with high-quality and without astigmatism in a horizontal geometry, with isometric resolution, thanks to the cross-beam geometry 3D adiabatically focusing lenses can be printed for maximizing the focusing efficiency and resolution.

Printing with various polymers such as KCL, SU-8 and HSQ can be imagined.

Incorporation of these polymers with various materials can be done for fine-tuning the optical response of the polymer for a specific X-ray energy.

The following table provides an overview of different parameters used for the printed optics and throughout the process.

The printed optics preferably had a diameter between 1 mm and 20 μm, more preferably between 300 μm and 30 μm, specifically 32 μm. Their outermost zone width preferably was between 5 μm and 50 nm, more preferably between 1 μm and 0.5 μm, specifically 0.8 μm. Their thickness was preferably between 20 μm and 0.1 um, more preferably between 8 μm and 0.5 μm, specifically 2 to 6 μm.

EXPERIMENTAL SECTION

High-performance kinoform X-ray lenses out of low-loss, plastic materials by using 2PP-based 3D nano-printing following the process schematically described in FIGS. 1a-2d have been fabricated. Printing the individual lenses (FIGS. 2c, 2d) took less than one minute, several orders of magnitude faster than alternative kinoform fabrication routes and any top-down method. The printing was done on a standard X-ray transparent $Si_3N_4$ membrane of 100 nm thickness. Consequently, the lenses could be directly inserted in the X-ray microscope without any further machining process. SEM images of the 3D-printed lenses exhibit precise replication of the design geometry (FIGS. 1c-e). The kinoforms nominally had 32 μm apertures and 800 nm outermost periods (effective $\Delta r$ of 400 nm) with 2 to 6 μm thicknesses leading to aspect-ratios of up to 7.5.

The polymers used in 3D printing offer superior optical properties for X-rays, whereby the amorphous nature eliminates the undesired diffraction present in polycrystalline media. Also, the photo-resist used in printing the Kinoform structures (IPL-780) has a large phase shift $(1-\delta)$ combined with a low absorption $(\beta)$ (see FIG. 9a-e). As depicted in FIG. 9f, the $\delta/\beta$ ratio of IPL-780 is significantly greater than that of aluminum, similar to that of diamond. Beryllium has a slightly larger $\delta/\beta$ ratio (FIG. 9f) but its nano-fabrication is troublesome with a non-ideal microstructure. Also, it is a highly toxic material that is difficult to handle.

It is believed that 3D nano-printing now allows realization of optics which were impossible to fabricate before. For instance, 3D printing can be used to integrate various optical elements as conceptually shown in FIG. 3a. Focusing optics can be integrated together with any optical device such as wavefront shaping and correction plates[26] and combine various functions even for hard X-rays. As an example, on-chip horizontal stacking of 9 kinoform lenses of 2-μm optical thickness achieving an effective aspect-ratio of 45 is shown in FIG. 3b. The estimated theoretical focusing efficiency as a function of number of stacked lenses significantly expands the energy range to several tens of keV (FIG. 8).

A concern in using polymeric lenses for focusing X-rays could be the radiation damage. In this study, no degradation was observed in the imaging properties of lenses over extended exposure to synchrotron radiation over several days. The SEM imaging after testing of the kinoform lenses showed no signs of structural change (FIG. 10).

In summary, a new paradigm of X-ray optics fabrication was introduced. Using a 2PP-based 3D nano-printing, high-performance point-focusing, plastic X-ray kinoform lenses were manufactured without geometrical approximations. The printing time for each kinoform lens was on the order of a minute. The lenses resolved 240 to 30 nm features in direct imaging and ptychography, respectively. Focusing efficiencies up to 20% was achieved in a range of 900-1800 eV with a strong improvement over kinoforms made via GS-IBL.

These first results show that 3D-printed plastic kinoforms are powerful and promising prototypes for new, advanced X-ray optics, whereby a one-step preparation route realizes complex and high-aspect-ratio 3D structures. An ample room for improvement regarding resolution, efficiency and the ease of the extension to the harder X-ray range is present and can be met by materials optimization and printing refinements. The attractive possibility for arrangements of multiple lenses and other optical elements in the near field will allow reaching the ultimate performance especially in the hard X-ray range where absorption is much less. The integration of several additional optical components would allow aberration corrections and wave-front manipulation with ease. Therefore, the 3D-printed plastic optics will open new capabilities in X-ray focusing and have a strong impact for the optimal use of new highly brilliant X-ray source as well advanced laboratory sources, where radiation intensity is still the most critical issue.

Materials and Methods

Chemical Composition Determination

The chemical composition of the IPL-780 photo-resist was determined by ELTRA-CS-800 Carbon-Sulphur determinator and ELTRA-ONH-2000 Oxygen-Nitrogen-Hydrogen determinator. The composition of the polymer was estimated to be 3.0 wt % hydrogen, 24.9 wt % oxygen, 0.8 wt % nitrogen and 71.2 wt % carbon.

Nano-Printing of Kinoform Lenses

The Kinoform lenses were printed directly on silicon nitride membranes (500 $\mu$m×500 $\mu$m×100 nm) as illustrated in FIG. 1a-1d. Briefly, the silicon frame was placed on a glass coverslip. A Si frame of 100 $\mu$m thickness was chosen to accommodate the short focal length of the objective lens. In between the membrane and the glass substrate, immersion oil was filled to minimize the refraction of the laser. A minute amount of IP-L 780 photoresist (less than 3 $\mu$L) was dropped on the top of the membrane. Commercially available Direct Laser Writing system (Photonic Professional, Nanoscribe GmbH) equipped with a 63× oil-immersion objective (numerical aperture: 1.4) was used for two-photon polymerization. The printed Kinoform lenses were developed in propylene glycol monomethyl ether acetate and isopropanol. The structures were then dried by critical point drying to effectively preserve the high-aspect features. Printing parameters of the evaluated lenses are listed in the Supplementary Table 1. The horizontally stacked kinofrom lenses were printed on standard glass substrate of 100 $\mu$m thickness. For the printing of horizontally stacked Kinoforms IP-S photo-resist was used.

Electron Microscopy Analysis

For the scanning electron microscopy (SEM) analysis a ZEISS Gemini 500 SEM with a Field Emission electron source was used. The samples were coated with 20 nm of carbon prior to SEM analysis. To minimize charging effects, beam deceleration was used while acquiring the SEM images.

REFERENCES

1 Evans-Lutterodt, K. et al. Single-element elliptical hard x-ray micro-optics. Opt. Express 11, 919-926, (2003).

2 Snigireva, I. et al. Holographic X-ray optical elements: transition between refraction and diffraction. *Nucl. Instrum. Methods Phys. Res., Sect. A* 467-468, Part 2, 982-985, (2001).

3 Fabrizio, E. D. et al. High-efficiency multilevel zone plates for keV X-rays. *Nature* 401, 895-898, (1999).

4 Takeuchi, A., Suzuki, Y., Uesugi, K., Okada, I. & Iriguchi, H. Performance Test and Evaluation of Multilevel Fresnel Zone Plate with Three-Step Profile Fabricated with Electron-Beam Lithography. *Jpn. J. Appl. Phys.* 51, 022502, (2012).

5 Hohmann, J. K., Renner, M., Waller, E. H. & von Freymann, G. Three-Dimensional $\mu$-Printing: An Enabling Technology. *Adv. Opt. Mater.* 3, 1488-1507, (2015).

6 Pfeiffer, F. X-ray ptychography. *Nat. Photonics* 12, 9-17, (2018).

7 Yabashi, M. & Tanaka, H. The next ten years of X-ray science. *Nat Photon* 11, 12-14, (2017).

8 Lim, J. et al. Origin and hysteresis of lithium compositional spatiodynamics within battery primary particles. *Science* 353, 566-571, (2016).

9 Ohmer, N. et al. Phase evolution in single-crystalline LiFePO4 followed by in situ scanning X-ray microscopy of a micrometre-sized battery. *Nat. Commun.* 6, (2015).

10 Shapiro, D. A. et al. Chemical composition mapping with nanometre resolution by soft X-ray microscopy. *Nat. Photonics* 8, 765-769, (2014).

11 Schneider, G. et al. Three-dimensional cellular ultrastructure resolved by X-ray microscopy. *Nat. Methods* 7, 985-987, (2010).

12 Attwood, D. T. Soft x-rays and extreme ultraviolet radiation: principles and applications. (Cambridge Univ Press, 2000).

13 Sayre, D. Proposal for the utilization of electron beam technology in the fabrication of an image forming device for the soft x-ray region. (IBM Research Report, 1972).

14 Vila-Comamala, J. et al. Advanced thin film technology for ultrahigh resolution X-ray microscopy. *Ultramicroscopy* 109, 1360-1364, (2009).

15 Chao, W. et al. Real space soft x-ray imaging at 10 nm spatial resolution. *Opt. Express* 20, 9777-9783, (2012).

16 Schropp, A. et al. Hard x-ray scanning microscopy with coherent radiation: Beyond the resolution of conventional x-ray microscopes. *Appl. Phys. Lett.* 100, 253112-253113, (2012).

17 Kirz, J. Phase zone plates for x rays and the extreme uv. *J. Opt. Soc. Am.* 64, 301-309, (1974).

18 Keskinbora, K., Grévent, C., Hirscher, M., Weigand, M. & Schütz, G. Single-Step 3D Nanofabrication of Kinoform Optics via Gray-Scale Focused Ion Beam Lithography for Efficient X-Ray Focusing. *Adv. Opt. Mater.* 3, 792-800, (2015).

19 Sakellari, I. et al. 3D Chiral Plasmonic Metamaterials Fabricated by Direct Laser Writing: The Twisted Omega Particle. *Adv. Opt. Mater.* 5, 1700200, (2017).

20 Gissibl, T., Thiele, S., Herkommer, A. & Giessen, H. Two-photon direct laser writing of ultracompact multi-lens objectives. *Nat. Photonics* 10, 554-560, (2016).

analysis. To further investigate the radiation resistance, we performed SEM imaging after testing the lenses at the Synchrotron. We have seen no evidence of any structural deterioration.

Printing Parameters of Kinoform Lenses, NFLS and Stacked Kinoform Lenses

TABLE S1

Overview of the laser power and scan speed parameters used for 3D printing. Intensity, fluence and dose values at the focal spot disregard the energy losses at the optical components and the absorption in the photoresist.

| Type of Optic | Photo resist | Optical thickness | Laser Power (mW) | Scan Speed (mm s$^{-1}$) | Contour Number | Peak Intensity (TW cm$^{-2}$) | Fluence (J cm$^{-2}$) | Dose (μJ) |
|---|---|---|---|---|---|---|---|---|
| Kinoform | IPL-780 | 2 μm | 32 | 26 | 3 | 0.239 | 0.029 | 1.231 |
| | | 2 μm | 32 | 25 | 3 | 0.239 | 0.029 | 1.280 |
| | | 2 μm | 33 | 25 | 3 | 0.247 | 0.030 | 1.320 |
| | | 2 μm | 33 | 23 | 3 | 0.247 | 0.030 | 1.435 |
| | | 4 μm | 24 | 15 | 2 | 0.179 | 0.022 | 1.600 |
| | | 4 μm | 28 | 15 | 2 | 0.209 | 0.025 | 1.867 |
| | | 4 μm | 28 | 15 | 2 | 0.209 | 0.025 | 1.867 |
| | | 6 μm | 26 | 15 | 2 | 0.194 | 0.023 | 1.733 |
| | | 6 μm | 26 | 15 | 2 | 0.194 | 0.023 | 1.733 |
| Horizontally stacked kinoform | IP-S | 9 × 2 μm | 32 | 15 | 3 | 0.239 | 0.029 | 2.133 |

21 Ceylan, H., Yasa, I. C. & Sitti, M. 3D Chemical Patterning of Micromaterials for Encoded Functionality. *Adv. Mater.* (Weinheim, Ger.) 29, 1605072, (2017).

22 Frenzel, T., Kadic, M. & Wegener, M. Three-dimensional mechanical metamaterials with a twist. *Science* 358, 1072-1074, (2017).

23 Jayne, R. K., Stark, T. J., Reeves, J. B., Bishop, D. J. & White, A. E. Dynamic Actuation of Soft 3D Micromechanical Structures Using Micro-Electromechanical Systems (MEMS). *Adv. Mater. Technol.,* 1700293, (2018).

24 Richter, B. et al. Guiding Cell Attachment in 3D Microscaffolds Selectively Functionalized with Two Distinct Adhesion Proteins. *Adv. Mater.* 29, 1604342, (2017).

25 Mueller, P., Thiel, M. & Wegener, M. 3D direct laser writing using a 405 nm diode laser. *Opt. Lett.* 39, 6847-6850, (2014).

26 Seiboth, F. et al. Perfect X-ray focusing via fitting corrective glasses to aberrated optics. *Nat. Commun.* 8, 14623, (2017).

27 Follath, R., Schmidt, J. S., Weigand, M. & Fauth, K. The X-ray microscopy beamline UE46-PGM2 at BESSY. *AIP Conf. Proc.* 1234, 323-326, (2010).

28 Marchesini, S. et al. SHARP: a distributed GPU-based ptychographic solver. *J. Appl. Crystallogr.* 49, 1245-1252, (2016).

29 Henke, B. L., Gullikson, E. M. & Davis, J. C. X-Ray Interactions: Photoabsorption, Scattering, Transmission, and Reflection at E=50-30,000 eV, Z=1-92. *At. Data Nucl. Data Tables* 54, 181-342, (1993).

Radiation Resistance of Tested Kinoform Lenses

We observed no evidence of radiation damage in our 3D printed Kinoform lenses during extensive Synchrotron Further goals, advantages, features and applications of the invention arise out of the following description of embodiments of the invention on the basis of the figures. Thereby, all features which are described and/or illustrated in the figures alone or in arbitrary reasonable combination provide the subject matter of the invention independent of its conclusion in the claims or its dependency.

It shows:

FIG. 2a: a CAD model of a structure of an optic which is to be produced by the method according to the present invention, FIG. 2b: SEM image of a nano-printed half-kinoform lens, FIG. 2c: a portion of an array of kinoform lenses printed with different parameters, FIG. 2d: a magnified central part of a kinoform lens of FIG. 2c, FIG. 3a-3d: different types of single optics or stacks of optics, FIG. 4a: a grid of printed voxels, FIG. 4b: a simplified illustration of a grid of voxels FIG. 5a: a schematic illustration of a printed mold, FIG. 5b a schematic illustration of a printed mold filled with an optic, FIG. 6a, 6b, 6c schematic illustrations of different kinoforms, FIG. 7 a schematic illustration of a double-sided optic, FIG. 8 the focusing efficiency of the stacked lenses shown in FIGS. 3a and 3b, FIG. 9a-9f delta and beta values for IPL-780 compared with common X-ray optical materials and FIG. 10 an SEM image of 3D printed Kinoform lens after the Synchrotron testing.

FIG. 1a-d in combination with FIG. 2a and FIG. 4 show schematic overviews of systems for performing a method according to the present invention. According to FIG. 1a-d, an overview as well as a detailed illustration (within illustrated circle) of the printing process/method is provided.

A micro-scaled or nano-scaled XUV and/or X-ray Diffractive optic (1) is produced, the method including the following steps:

a) providing a material (2) being photo-sensitive and being polymerizable by two-photon-absorption, b) providing data (3) of a desired geometrical structure (4) of the optic (1) and creating at least one trajectory (8) corresponding to the data (3) of the desired structure (4) of the optic (1), c) providing a high-intensity energy beam (5), in particular a laser beam, wherein the beam (5) comprises a focus (F) having a position being adjustable to a plurality of positions (F1, F2, . . . , Fp) being coincident with the at least one trajectory (8), d) polymerization of the material (2) by two-photon-absorption at a first position (Fn) of the focus (F), thereby creating a first voxel (vn1n2n3) of the structure (4) of the optic (1), e) adjusting the position of the focus (F) from the first position (Fn) to a subsequent position (Fn+1) of the focus (F) along the at least one trajectory (8) and repeating step d) at the subsequent position (Fn+1) of the focus (F), wherein a distance (d) between each of the positions (F1, F2, . . . , Fp) of the focus (F) and at least one of the rest of the positions (F1, F2, . . . , Fp) of the focus (F) is smaller than a mean diameter (vd) of the voxels produced at these positions with respect to their dimension parallel to the distance (d).

One will understand that the system is also suitable for printing a mold (16) for an optic (1) (see FIG. 5a).

According to FIG. 1a-d, the beam (5) is emitted by a beam source (13) following a beam direction (5a) extending towards the material (2).

According to FIGS. 1a, 1b and 1d, the beam source (13) is arranged on a first side (9a) of a first substrate (9) opposite from a second substrate (7). According to FIG. 1c, the beam source (13) is arranged on a second side (9b) of a first substrate (9) being directed towards the second substrate (7).

The first substrate (9) is transparent to the beam (5). The second substrate (7) is transparent to the beam (5) and has an aperture (10). According to FIG. 1a-d, the aperture (10) has the shape of a taper segment with a diameter decreasing from a first side (7a) of the second substrate (7) which is placed on the first substrate (9).

In each embodiment, a first side (12a) of a membrane (12) being XUV ray and/or X-ray transparent, in this case a silicon nitride membrane, is placed on a second side (7b) of the second substrate (7) opposite from the first side (7a).

According to FIG. 1d, a second beam source (13') arranged on the second side (12b) of the membrane (12) is shown and could be used simultaneously or as an alternative to the first beam source (13). According to this embodiment, the beam (5) of the first beam source (13) and a beam (5') of the second beam source (13') are running towards each other. It is conceivable that the second beam source (13') acts as a redundancy and thus prevents system failure if the first beam source (13) should break down or be shut off for a specific time span due to overheating or the like. It should be noted that the position of the second beam source (13') is illustrated as being shifted just for the sake of clarity, in order not to cover the detailed illustration of the beam (5).

FIG. 1e shows an embodiment comprising a second beam source (13') wherein the beam (5) of the first beam source (13) and a beam (5') of the second beam source (13') are running perpendicular to each other. In this case, the position of the focus (F) of the first beam source (13) is identical to the position of the focus (F') of the second beam source (13'). For the sake of clarity, the rest of the components is omitted. It is conceivable that the arrangement reassembles the arrangement according to FIG. 1d (except for the orientation of the beam (5') of the second beam source (13')).

FIG. 1f shows the beam (5) of the first beam source (not shown) and its focus (F). FIG. 1g shows the beam (5) of the first beam source (not shown) and its focus (F) as well as the beam (5') of the second beam source (not shown) and its focus (F'). The focal intensity distribution is in each case plotted as contours. The single femtosecond laser beam (5) of FIG. 1f is focused tightly to produce a non-linear elliptical interaction volume (voxel V') that leads to different axial b and lateral resolution a. According to FIG. 1g, two tightly focused femtosecond laser beams (5) and (5') are crossed to create two elliptical interaction volumes. The intensities of the individual beams (5) and (5') are tuned down such that their focal intensity distribution is always below the two-photon absorption threshold. However, when the two-beams (5) and (5') are crossed, the combined intensity at the common focus (F)=(F') overcomes the threshold creating an isometric volume (voxel V'').

The resulting voxel V'' is illustrated as a FEM model in FIG. 1h, its shape representing the intersection of two ellipses at right angles in three dimensions. The intersection of two-ellipses is similar to intersection of two-cylinders at right angles which is called a Steinmetz solid or a bicylinder. This volume is much smaller compared to individual ellipses and has fairly isometric dimensions compared to an ellipse.

Instead of or additionally to adjusting a position and/or an orientation of the beam source (13), it is also conceivable that a position and/or an orientation of the rest of the system (e.g. of the first substrate (9), second substrate (7), membrane (12)) is adjusted. For example, it is possible to turn the rest of the system by an angle of 180° with respect to the beam direction (5a), as illustrated by the embodiment of FIG. 1c.

The beam (5) is guided through immersion oil (11) placed within the aperture (10) of the second support (7) and on the side (9a) of the first substrate (9) towards the beam source (13), in order to limit diffraction. This applies to the embodiments shown by FIGS. 1a and 1d. In this cases, the material (2) is placed only on a second side (12b) of the membrane (12).

According to the embodiment shown by FIG. 1b, there is immersion oil (11) only between the first substrate (9) and the beam source (13). The material (2) is placed within aperture (10) of the second support (7) and thus on both sides (12a, 12b) of the membrane (12), thereby enabling double sided patterning.

According to the embodiment shown by FIG. 1c, the material (2) is placed at least on the second side (12b) of the membrane (12). The material (2) could also be placed within the aperture (10) of the second support (7) and thus on both sides (12a, 12b) of the membrane (12). However, it is also conceivable that immersion oil (11) instead of the material (2) is placed within the aperture (10) of the second support (7).

It is conceivable that an adhesion promoter (14) is placed between the membrane (12) and the material (2) prior to printing (see FIG. 1d).

The beam (5) is first guided through the first substrate (9) and afterwards through the aperture (10) of the second substrate (7) (see FIGS. 1*a*, 1*b* and 1*d*) or first through the aperture (10) of the second substrate (7) and afterwards through the first substrate (9) (see FIG. 1*c*).

In each case, the beam (5) is shown being activated. The position of the focus (F) is located within the material (2) and can be adjusted to different positions. Thus, a structure (4) of the optic (1) is successively produced.

FIGS. 1*a* and 1*d* show one-sided printing. FIGS. 1*b* and 1*c* show double sided printing.

In the embodiment according to FIG. 1*a-d*, the position of the focus (F) is adjusted by adjusting a deflection of the beam (5). A suitable device for adjusting the deflection of the beam (not shown) includes for example one or more mirrors and is well known from prior art. The data (3, 3') of a desired geometrical structure (4) of the optic (1) are provided to a (not shown) control unit of the device for adjusting the deflection of the beam of the first (13) and/or a second beam source (13') (see FIG. 1*d-f*).

FIG. 2*a* shows a CAD file being generated from a mathematical model of the optic (1) (here: a kinoform lens), thereby providing data (3) of the structure (4) of the optic (1). Half of the structure is hidden to better illustrate the geometry of the structure (4). FIG. 2*b* shows an SEM image of a nano-printed half-kinoform lens illustrating the cross-section profile (scale bar is 5 μm). The lens according to FIG. 2*b* was produced by using the data (3) of the CAD file according to FIG. 2*a*. The position of the focus (F) can be adjusted by providing the data (3) to a control unit of the (not shown) suitable device for adjusting the deflection of the beam (5).

FIG. 2*c* shows a portion of an array of kinoform lenses (20) printed with different parameters (scale bar is 10 μm). FIG. 2*d* shows a magnified central part of a kinoform lens (20) belonging to the array of FIG. 2*c*. The lens (20) exhibits a high-quality surface and very well defined features (scale bar is 2 μm).

More specifically, FIGS. 1*a* to 2*d* illustrate an overview of a preferred fabrication method. A system like it is illustrated in FIG. 1*a* could be used for the 3D nano-printing of plastic X-ray lenses on X-ray transparent support membranes, e. g. $Si_3N_4$ membranes. A tightly focused high-power infrared laser creates an intense focus to promote non-linear absorption of photons in the central portion of the Gaussian focus causing a two-photon-polymerization of the photo-resist. This allows exposing features smaller than the wavelength. As mentioned above and illustrated in FIG. 2*a* a CAD file was generated from a mathematical model of the kinoform lens. Half of the structure is not shown to better illustrate the geometry of the structure. FIG. 2*b* shows an SEM image of a nano-printed half-kinoform lens which shows the cross-section profile in more detail. The scale bar in FIG. 2*b* represents 5 μm. FIG. 2*c* shows a portion of an array of kinoform lenses printed with different parameters. The scale bar in this figure represents 10 μm. the scale bar in FIG. 2*d* represents 2 μm. As it can be derived from this figure which shows the magnified central part of the kinoform lens of FIG. 2*e* this lens exhibits a high-quality surface and provides very well defined features.

FIG. 3*a* shows different applications of 3D nano-printing to advanced X-ray optics. It is possible to integrate any type of X-ray optical element (optic (1)) into a stack (25) or array (26) of lenses. The optics (1) can be kinoforms (20) with or without achromatic elements (21), beam splitters, phase plates (22), wavefront shaping (23) and aberration correcting elements or any arbitrary optical elements (24). A preferred beam direction (5*a*) which in this case represents a preferred printing direction is shown being perpendicular to a central axis of at least one of the optics (1), here of the first kinoform (20). This ensures that if optics are to be produced within the stack of optics, the laser beam is not guided through optics which printing process has already been finished.

FIG. 3*b* shows a stack (25) of horizontally stacked kinoform lenses (20), each lens (20) having 2 μm optical thicknesses (a 1 μm thick support element is printed along with the kinoforms (20)). The combined filtering of incident radiation due to the support structure is in the order of a few percent at 8 keV, and strongly decreases as energy increases. FIG. 3*c* shows a magnified portion of FIG. 3*b*.

FIG. 3*d* shows an array (26) of kinoform lenses (20).

All optics (1) shown have been dried by critical point drying after step e) had been finished.

FIG. 4*a* schematically shows a layer of voxels (v111, . . . , v13 1 4) after polymerization, in this example comprising 13 voxels in a first direction x', one voxel in a second direction y' and four voxels in a third direction z'. Each voxel v111, . . . , v13 1 4 is shown to have the shape of an ellipsoid comprising two diameters (see d1 in direction of y' and d113, d114 illustrated for voxels v113, v114). Moreover, each voxel v111, . . . , v13 1 4 is shown to comprise an overlap with at least two other voxels. This is due to the fact that the distance d between two of said positions—shown for positions F113 and F114 for voxels v113 and v114—is smaller than a mean diameter (d113+ d114)/2 of both voxels v113 and v114 with respect to the dimension z' being parallel to the distance (d).

FIG. 4*b* schematically illustrates a trajectory (8) and different positions (F1, . . . , F8) of the focus (F) coincident with the trajectory (8). Except for the distance (2*d*) between (F7) and (F8) with respect to dimension x', there is an equal distance (d) between two subsequent focus positions. In this case, the distance (2*d*) between (F7) and (F8) is bigger than the mean diameter (d7+d8)/2 of both voxels (V7), (V8) to be created at positions (F7) and (F8). However, overlap of the voxel (V8) to be created at position (F8) can be achieved by overlapping said voxel (V8) with the voxel (V4) with respect to dimension z'.

FIG. 5*a* shows a mold (16) and its central axis (16*a*) which has been printed following a method as described above. The mold (16) comprises a desired geometrical structure (4') or a shape being complementary to the shape of the desired optic (1). Two coordinate systems are shown: one cartesian coordinate system (x, y, z) and one polar coordinate system (r, t, φ) just to illustrate that the mold (16) as well as the optic (1) can be described using each of both systems. After printing the mold (16), it can be filled (see FIG. 5*b*) with a second material (17), preferably by atomic layer deposition, thereby creating a desired structure (4) of the optic (1).

FIG. 6*a* shows a straight FZP 15*a* with different zones 6*a*, . . . , 6*f* (not all shown for the sake of clarity). As known for FZPs, adjacent zones provide different values of optical density. The thickness and the distance towards a central axis 17*a* of each of the different zones 6*a*, . . . , 6*f* of a straight FZP 15*a* remain the same over the whole length of the central axis 17*a*.

FIG. 6*c* shows a tilted FZP 15*b*. The thickness towards a central axis 17*b* of each of the different zones of a tilted FZP 15*b* remain the same over the whole length of the central axis 17*b*. For a tilted FZP 15*b*, all the zones are tilted to a single angle θ over the whole length of the central axis 17*b*.

For a wedged or ideal FZP 15c with central axis 17c, as shown in FIG. 6c, all the individual zones with thickness $d_i$ are tilted to a different angle $\theta_i$ satisfying the Bragg condition.

FIG. 8 shows the focusing efficiency of the stacked lenses shown in FIGS. 3a and 3b as a function of energy and number of lenses. Each lens has a 2 μm optical thickness (this does not include the effect of support).

Figure 1A:
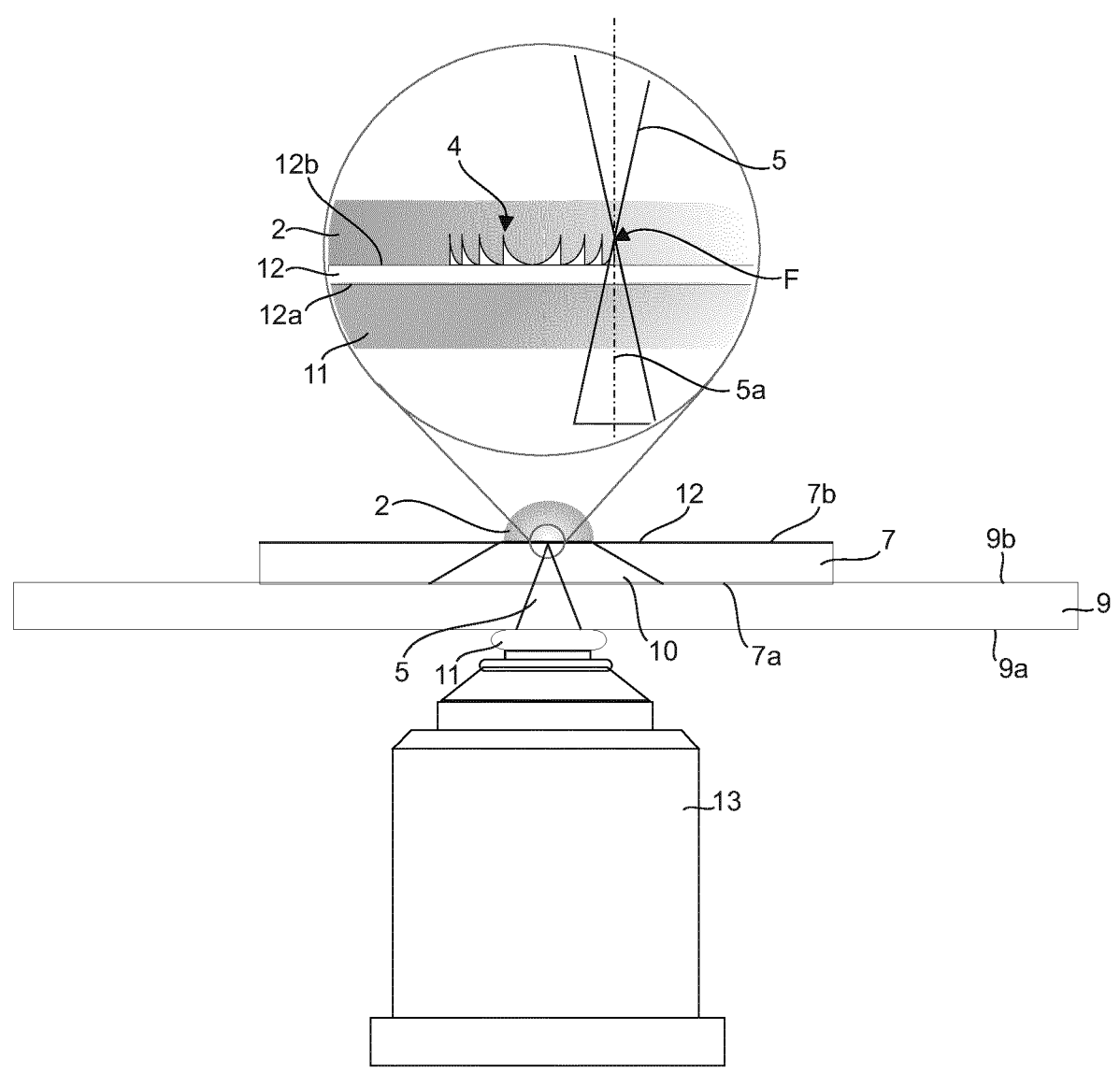
Figure 1B:
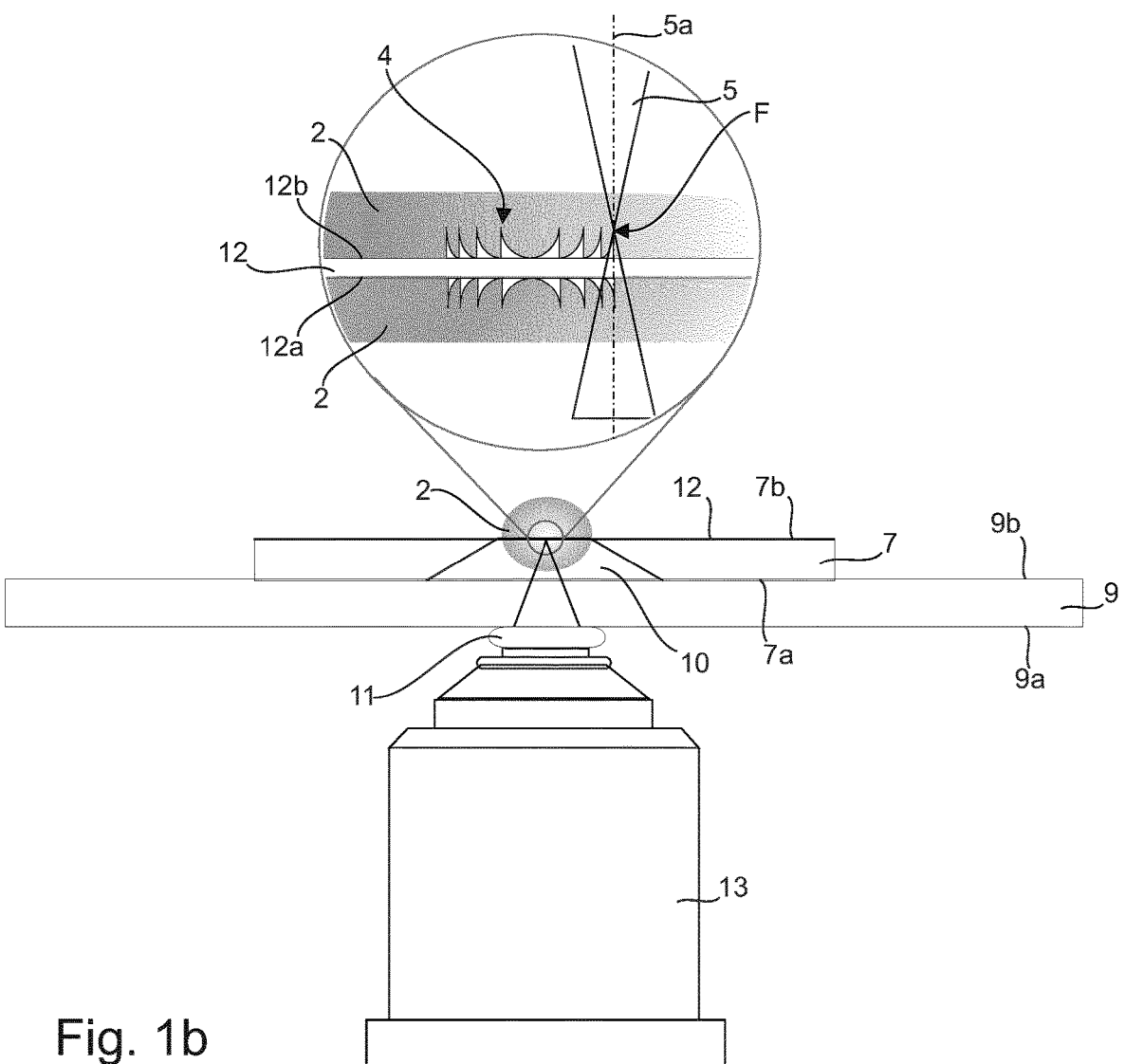
Figure 1C:
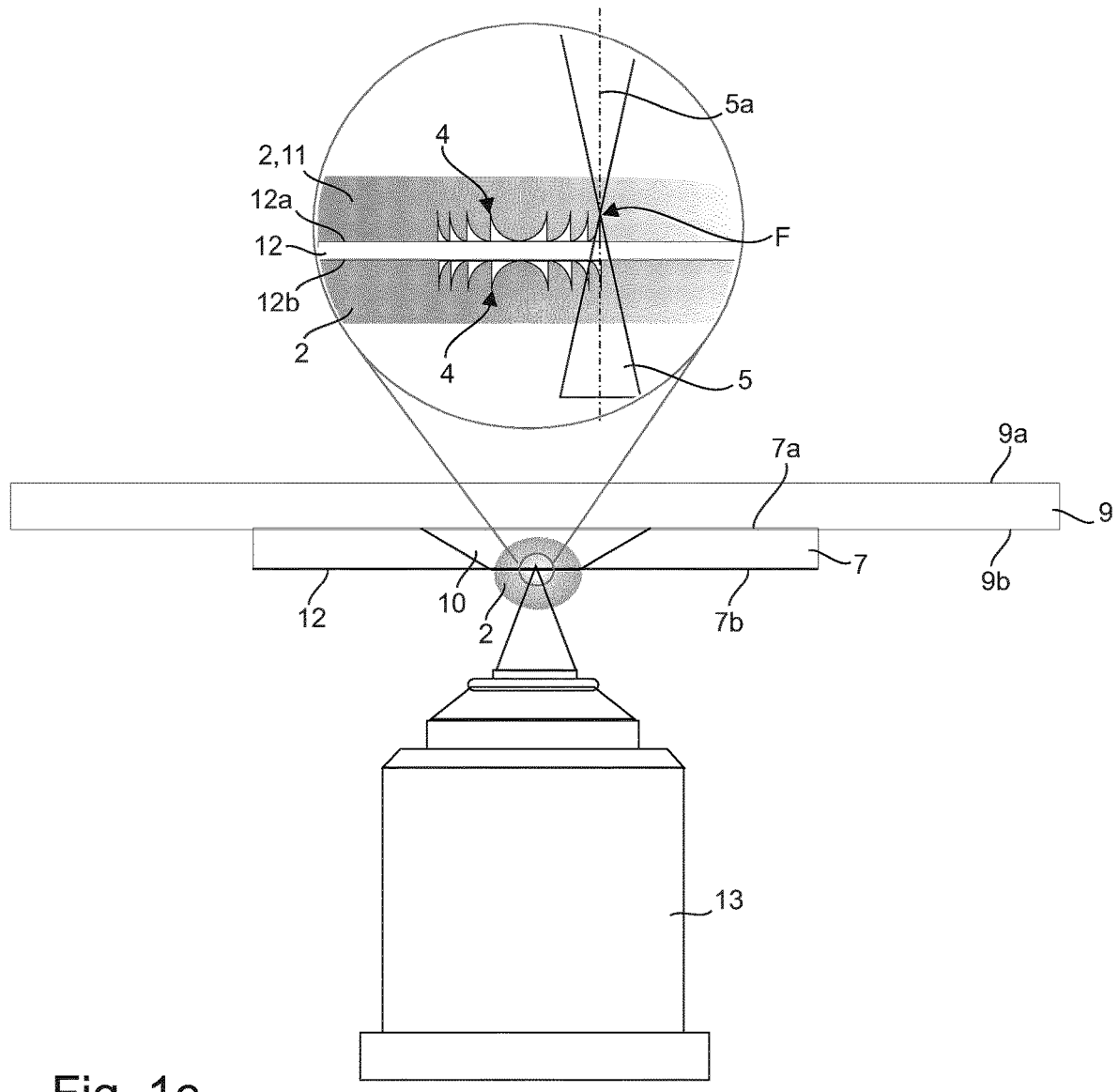
Figure 1D:
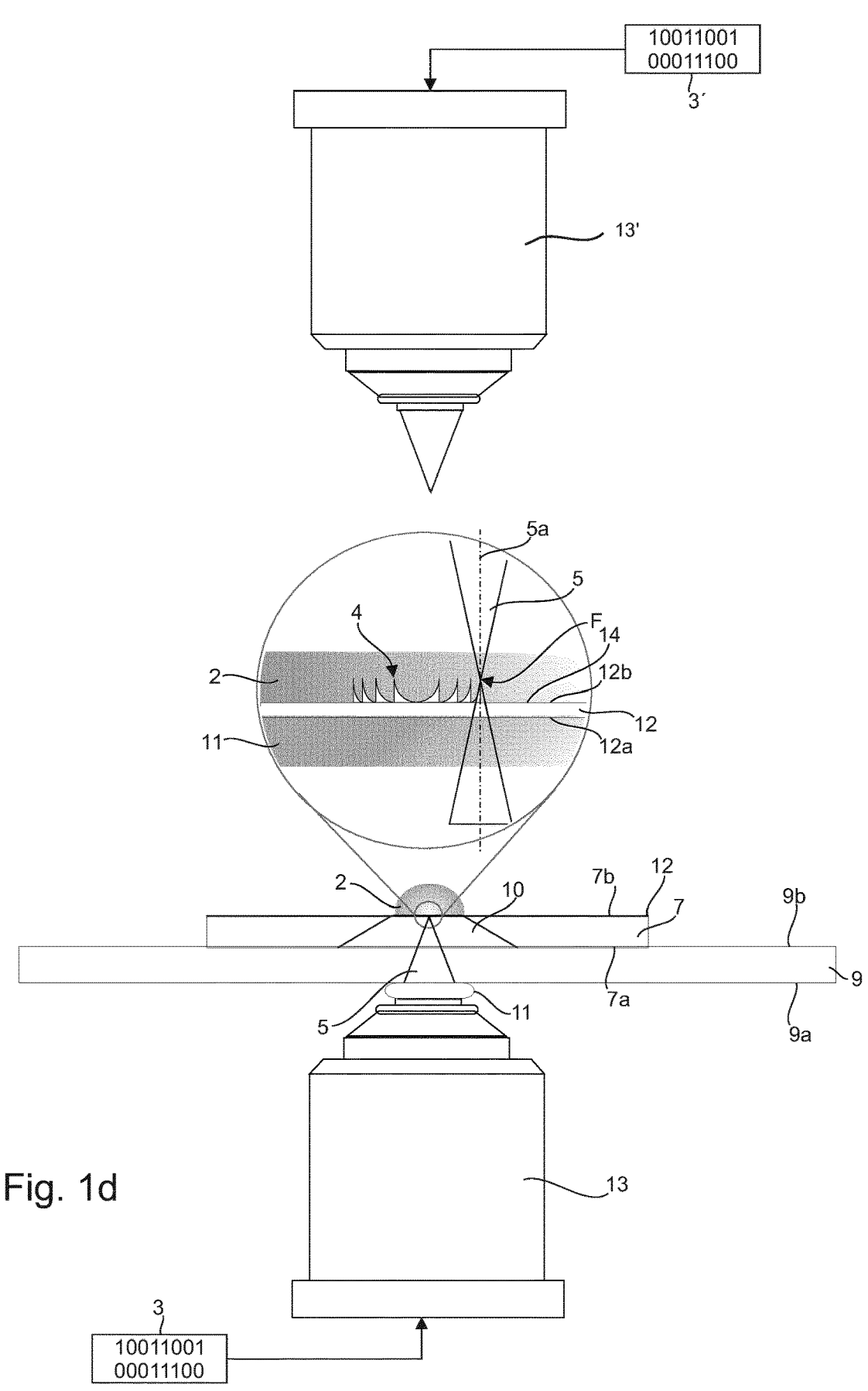
Figure 1E:
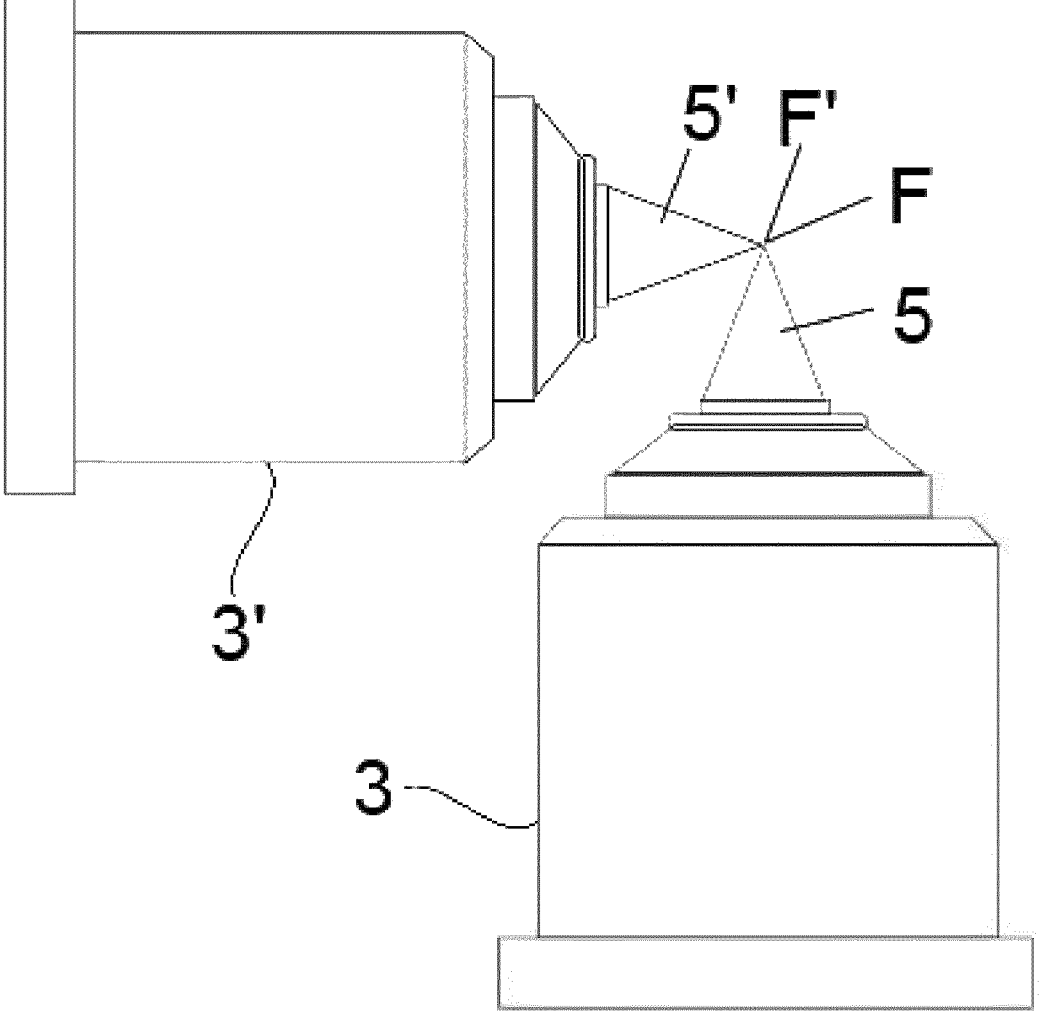
Figure 1F:
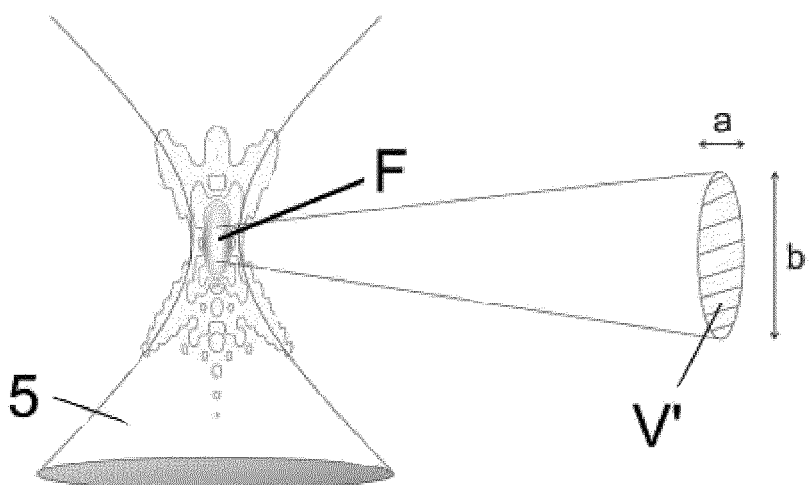
Figure 1G:
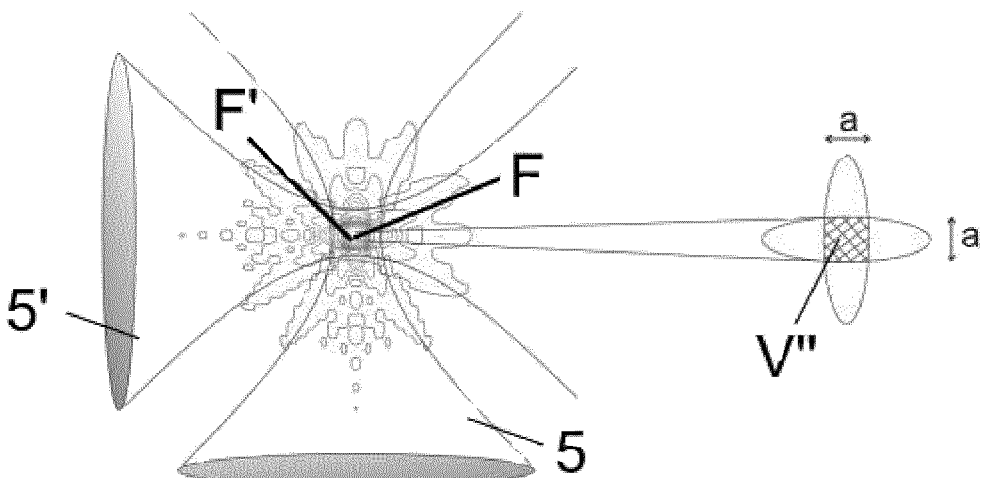
Figure 1H:
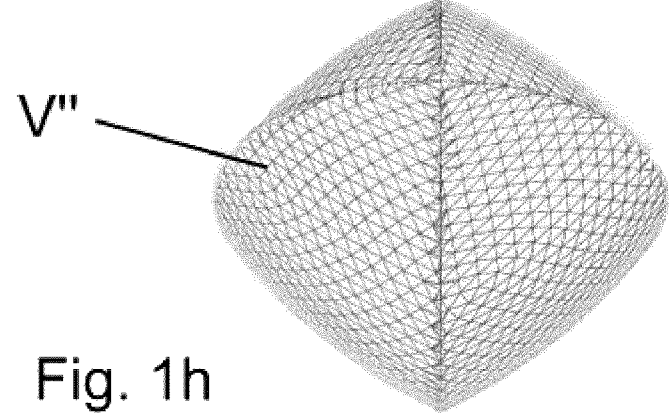
Figure 3A:
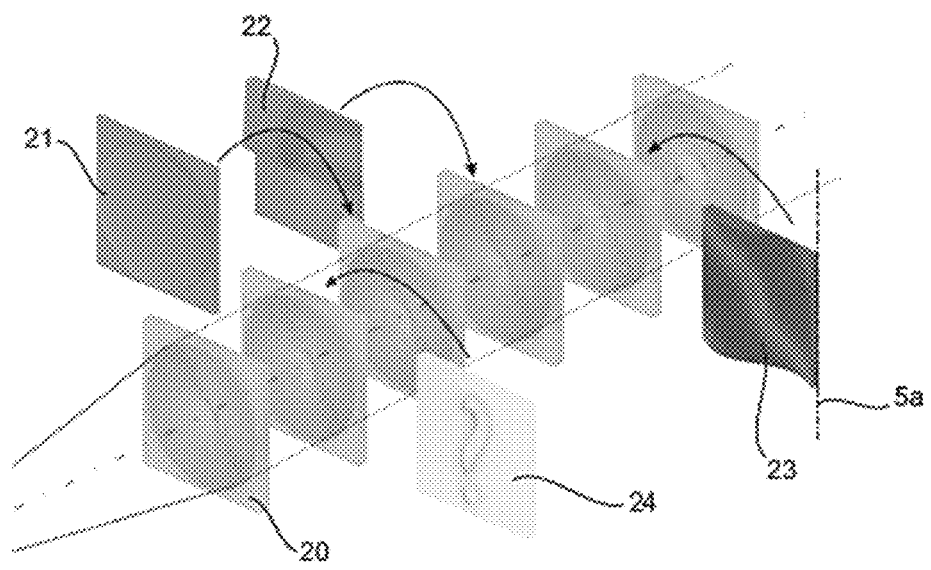
Figure 3B:
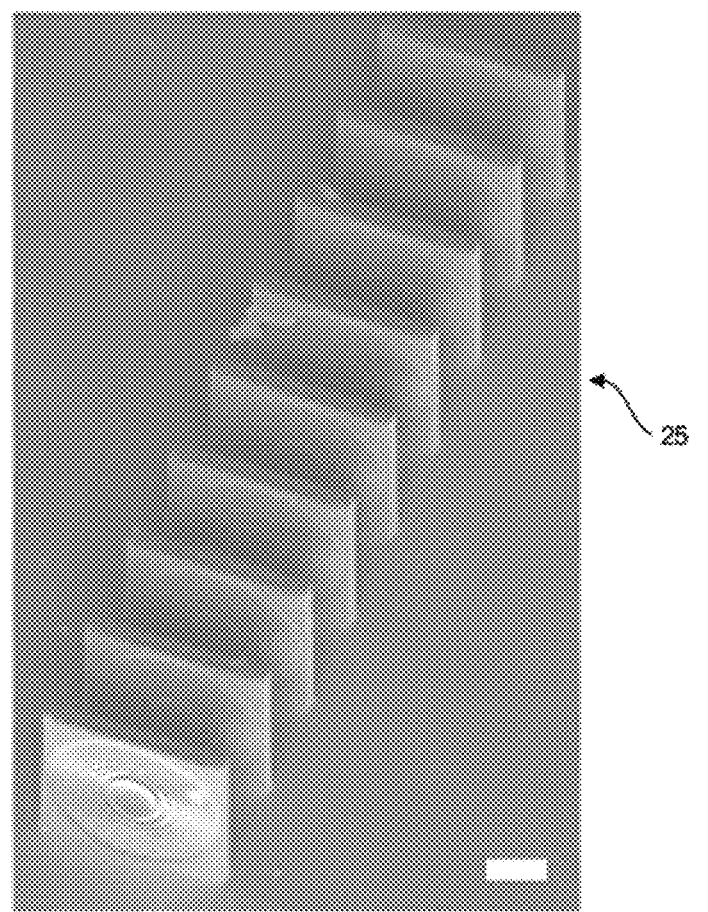
Figure 3C:
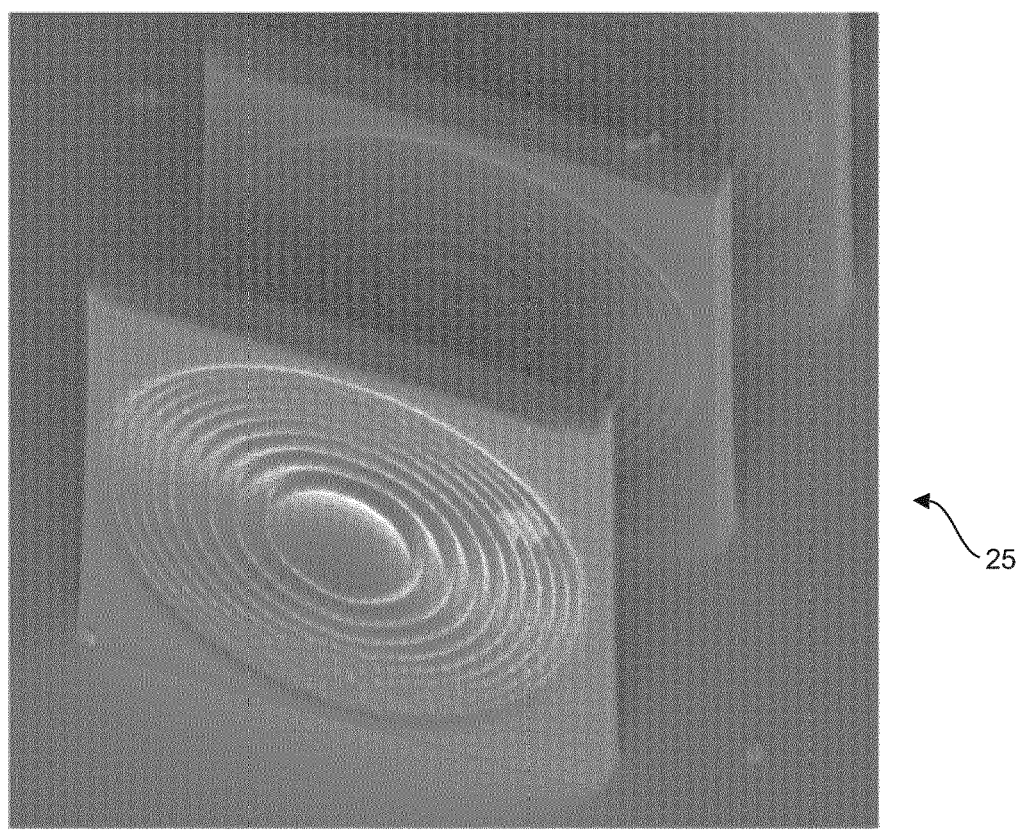
Figure 3D:
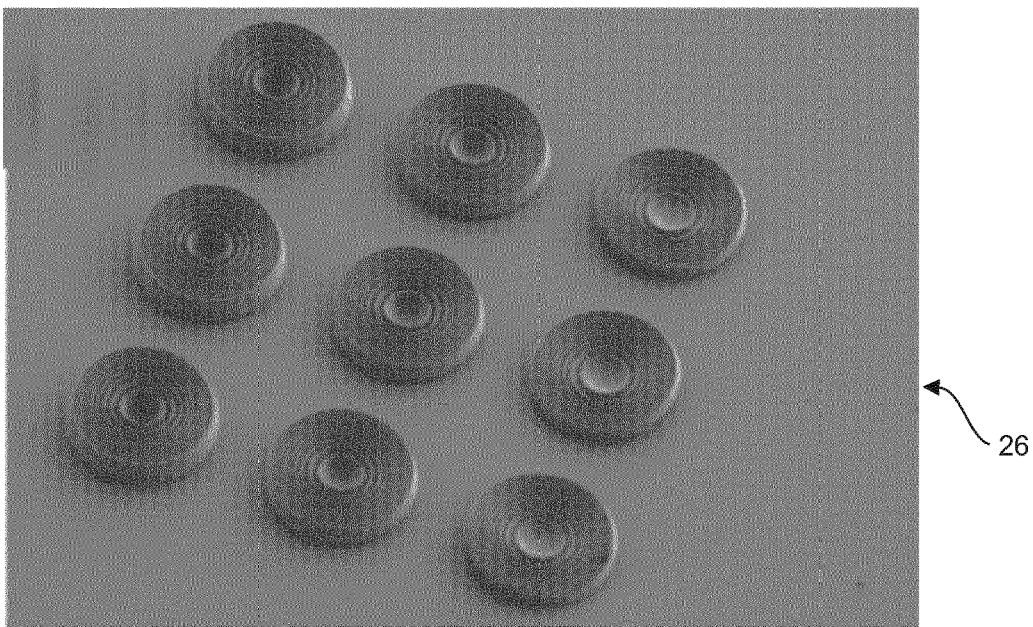
Figure 4A:
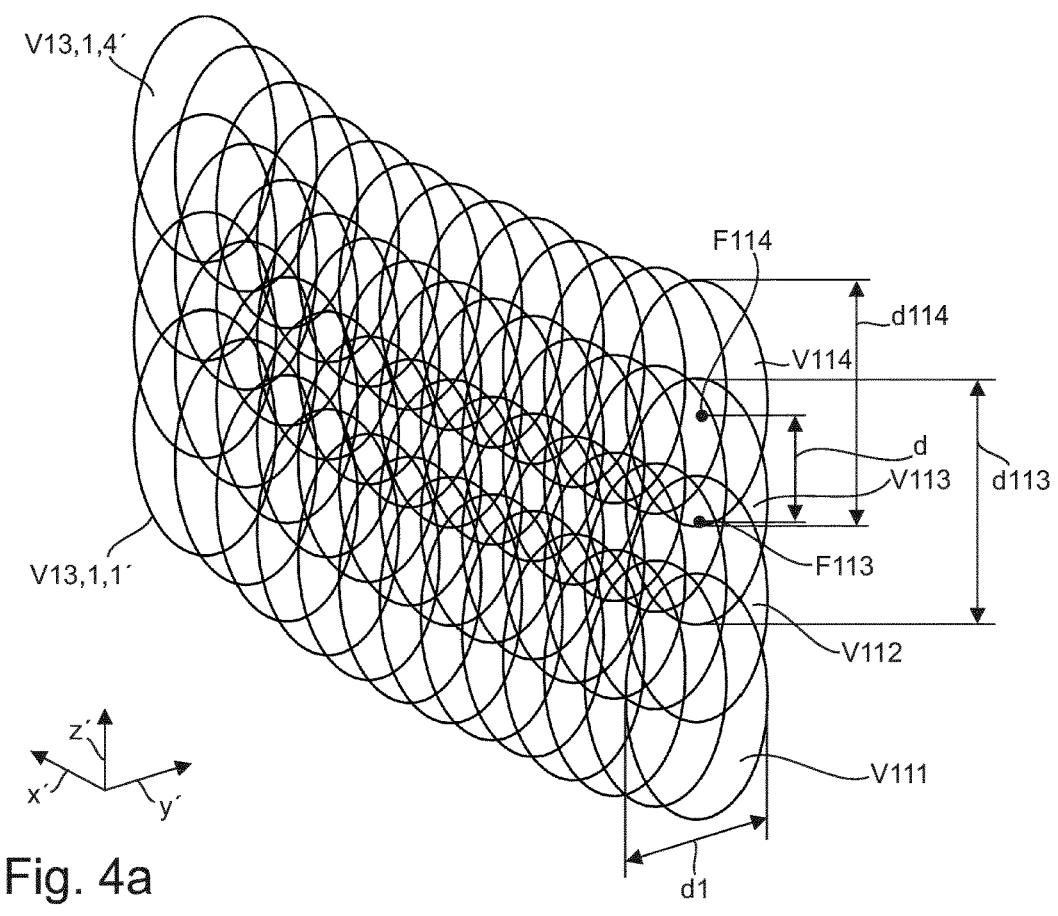
Figure 4B:
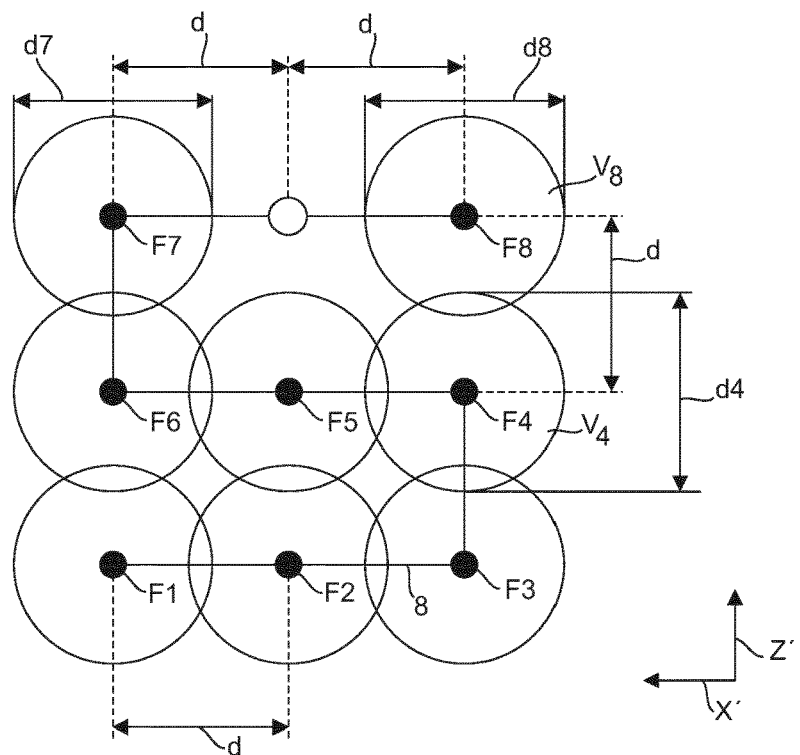
Figures 5A, 5B:
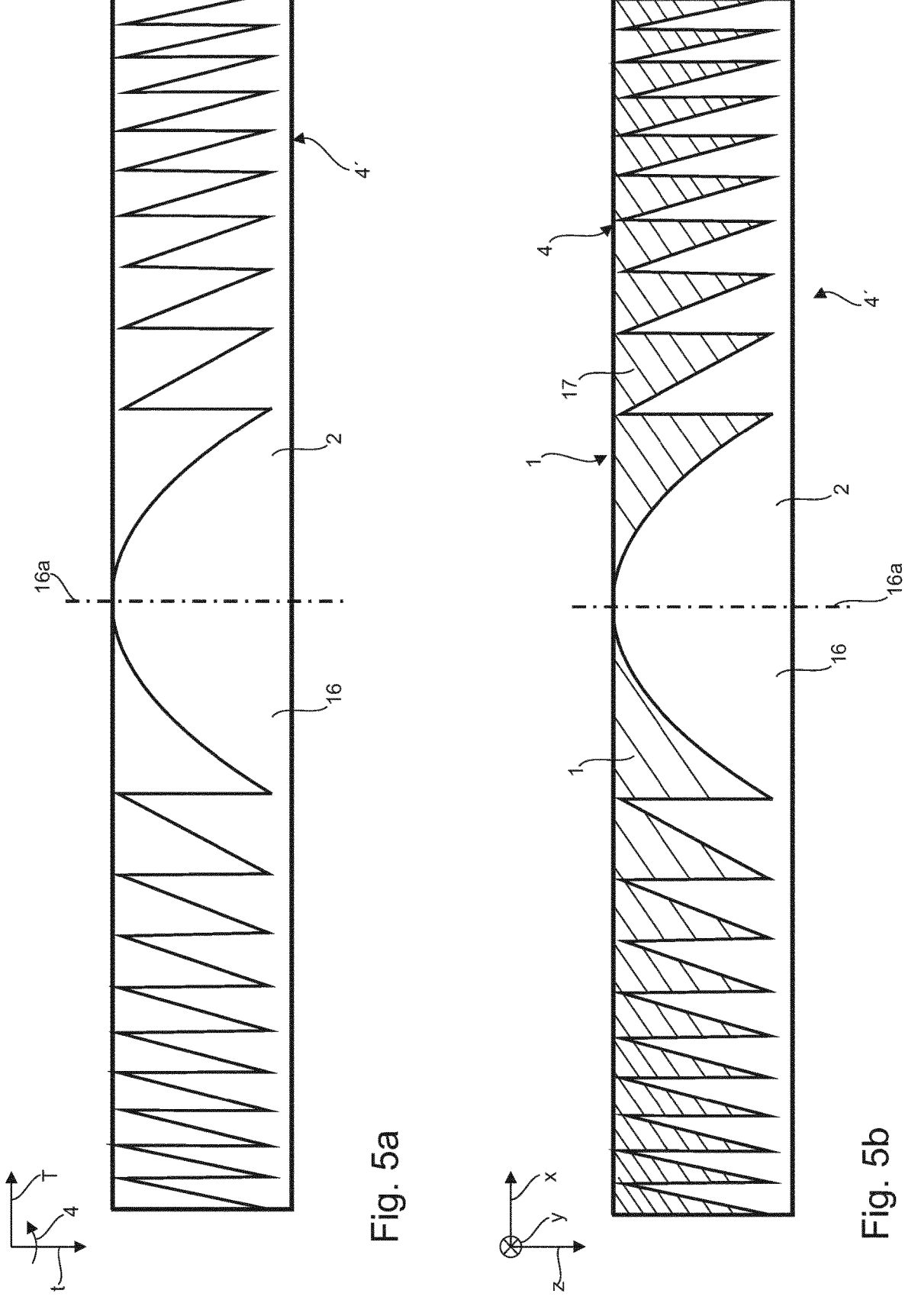
Figures 6A, 6B, 6C, 7:
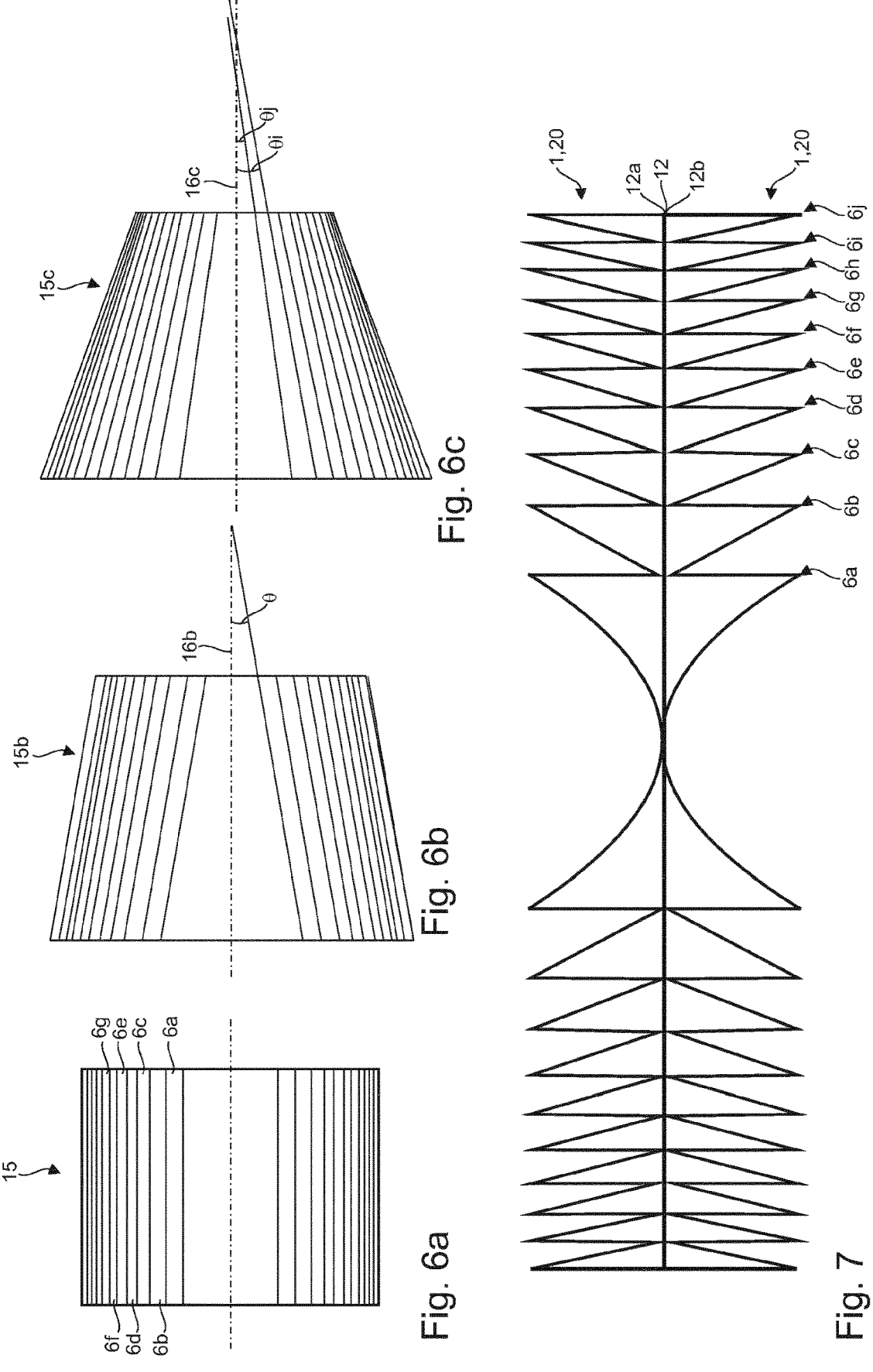
FIG. 7 shows double sided optic (1) in shape of a double sided kinoform (20) which has been printed at once on both sides (12a, 12b) of a membrane (12).

FIG. 9a-9f show delta and beta values for IPL-780 compared with common X-ray optical materials. FIG. 9a shows the values for Au of density, d=19.32 g/cm$^3$. FIG. 9b shows the values for Al of density, d=2.70 g/cm$^3$. FIG. 9c shows the values for IPL-780 of density, d=1.50 g/cm$^3$. FIG. 9d shows the values for Diamond of density, d=3.50 g/cm$^3$. FIG. 9e shows the values for Be of density, d=1.85 g/cm$^3$ and FIG. 9f shows a comparison of δ/β ratios. The data are acquired from Henke et al.[29]

The complex refractive index of a single element is given by[12]

$$n = 1 - \delta + i\beta \qquad \text{(Eq. 1)}$$

where the real part 1−δ corresponds to refraction and the imaginary part β corresponds to absorption. The δ and β can be related to the atomic scattering factors by $$\delta = \frac{n_a r_e \lambda^2}{2\pi} f_1^0(\omega) \qquad \text{(Eq. 2)}$$

and $$\beta = \frac{n_a r_e \lambda^2}{2\pi} f_2^0(\omega) \qquad \text{(Eq. 3)}$$

where $n_a$ is the number of atoms of type a per unit volume, $r_e$ is the scattering cross-section i.e. for, a single electron, $\lambda$ is the wavelength in vacuum. δ and β values for Au, Al, IPL-780, Diamond and Be are given as a function of X-ray energy in FIGS. 9a-9e. The δ/β ratios are depicted in FIG. 9f. The δ/β ratio of IPL-780 is similar to the δ/β ratio of Diamond.

To prove the durability of konoform lenses produced according to the present invention, the radiation resistance of kinoform lenses was tested. During these tests, no evidence of radiation damage in the kinoform lenses produced according to the present invention could be observed during extensive Synchrotron analysis. To further investigate the radiation resistance, SEM imaging after testing the lenses at the Synchrotron was performed. An SEM image of 3D printed Kinoform lens after the Synchrotron testing is shown in FIG. 10. As it could be derived from FIG. 10, no evidence of any structural deterioration could be observed. The scale of FIG. 10 represents 3 μm.

LIST OF REFERENCE SIGNS

1 optic
2, 17 material
3 data
4, 4' geometrical structure
5, 5' high-intensity energy beam
5a beam direction
6a-j zones
7, 9 substrate
7a, 7b side

8, 8' trajectory
9a, 9b side
10 aperture
11 immersion oil
12 membrane
12a, 12b side
13, 13' beam source
14 adhesion promoter
15a, 15b, 15c kinoforms
16 mold
16a, 17a, 17b, 17c central axis
20 kinoform lens
21 achromatic element
22 phase plate
23 wavefront shaping element
24 arbitrary optical element
25 stack
26 array
27 2D NFL
28 3D NFL
F, F' focus
F1, . . . , F114 position
d1, . . . , d114 diameter
V1, . . . , V114, V', V'' voxel
x, y, z; x', y', z' cartesian coordinates
r, t, φ polar coordinates
θ Bragg angle

The invention claimed is:

1. A method for printing a micro-scaled or nano-scaled XUV and/or X-ray diffractive optic, comprising the following steps:

a) providing a material comprising a first component and a second component, wherein the first component is photo-sensitive and is polymerizable by two-photon-absorption, wherein the second component comprises a metal salt and/or nano particles, and wherein the second component has a higher electron density than the first component and yields a specific refractive index and absorption value in the XUV and/or X-ray diffractive optic when the material is polymerized, b) providing data of a desired geometrical structure of the optic and creating at least one trajectory corresponding to the data of the desired structure of the optic, c) providing a first high-intensity energy beam, wherein the beam comprises a focus (F) having a position being adjustable to a plurality of positions (F1, F2, . . . , F8) being coincident with the at least one trajectory, d) polymerization of the material by two-photon-absorption at a first position (F1) of the focus (F), thereby creating a first voxel (V1) of the structure of the optic, e) adjusting the position of the focus (F) from the first position (F1) to a subsequent position (F2) of the focus (F) along the at least one trajectory (8) and repeating step d) at the subsequent position (F2) of the focus (F), wherein a distance (d) between each of the positions (F1, F2, . . . , Fp) of the focus (F) and at least one of the rest of the positions (F1, F2, . . . , Fp) of the focus (F) is smaller than a mean diameter (vd) of the voxels (V1, V2; V1, V6; V2, V3; V2, V5; V3, V4; V4, V5; V4, V8; V5, V6; V6, V7) produced at these positions with respect to their dimension parallel to the distance (d).

2. The method according to claim 1, wherein at least one further high-intensity energy beam is provided, wherein the first and the at least one further high-intensity energy beam intersect each other in an intersecting volume within the material, wherein in the intersecting volume, a sum of energies provided by the first and the at least one further high-intensity energy beam exceeds a threshold value necessary for initiation of polymerization by two-photon-absorption.

3. The method according to claim 1, wherein the position of the focus (F) is successively adjusted up to a last position (F8) of the focus (F), thereby creating a plurality of voxels (V1, . . . , V8) of the structure of the optic.

4. The method according to claim 1, wherein the geometrical structure of the of the optic is described having Cartesian (x, y, z) or polar coordinates (r, t, φ), wherein a plurality of voxels is created in multiple successive steps, wherein in each one of the successive steps, the position of the focus (F) of the beam comprises a constant value with respect to a first one (z; t) of the coordinates (x, y, z; r, φ, t) throughout the whole step.

5. The method according to claim 4, wherein each of the successive steps is divided into multiple successive step portions, wherein in each one of the step portions, the position of the focus (F) of the beam comprises a constant value with respect to a second one (x; r) of the coordinates (x, y, z; r, φ, t) throughout the whole step portion.

6. The method according to claim 1, wherein the optic comprises a plurality of optical components, wherein at least one of the plurality of optical components is selected from the group comprising a kinoform, a zone plate, a lens or a nano-focusing lens having a cylindrical, spherical, parabolic, elliptic, achromatic or holographic geometry, a wavefront shaping element, a wavefront shaping plate, an aberration corrector, a wavefront corrector, an achromatic element, a phase plate optic or a free-form optic, or the optic is a stack or an array of more than one of any of these optical components.

7. The method according to claim 1, wherein the optic is a kinoform comprising a geometrical profile being calculated according to the following equations:

$$t(r) = \text{Mod}[(r/f)^2, 1], \quad (1)$$

$$F = B\sqrt{\frac{f}{E}}, \quad (2)$$

where t(r) is a height of the kinoform as a function of its radius r, Mod is a modulo function where 1 is the dividend, F (μm) is a parameter which depends on a focal length f and on an operating energy of the kinoform and on an constant B.

8. The method of claim 7, wherein the constant B has a value between 45 and 55.

9. The method of claim 7, wherein the constant B has a value of 49.8.

10. The method according to claim 1, wherein the optic is dried by critical point drying after step e) has finished.

11. The method according to claim 1, wherein except for a first one (V1), every voxel (V1, . . . , V8) is created adjacent to at least one existing voxel (V1, . . . , V8).

12. The method of claim 11, wherein every voxel (V1, . . . , V8) is created adjacent to at least one existing voxel (V1, . . . , V8), forming a coherent connection to the at least one adjacent existing voxel (V1, . . . , V8).

13. The method according to claim 1, wherein a plurality of voxels (V1, . . . , V8) is created by adjusting the position of the focus (F) of the beam to move along a single continuous trajectory.

14. The method according to claim 1, wherein the position of the focus (F) is adjusted by moving the material directly or indirectly or by adjusting a deflection of the beam.

15. The method according to claim 1, wherein the beam is emitted by a first beam source following a beam direction extending from the first beam source towards the material,
wherein a first substrate being transparent to the beam and a second substrate being transparent to the beam and having an aperture are provided,
wherein a first side of the second substrate is placed on the first substrate, wherein a first side of a membrane being XUV ray and/or X-ray transparent, is placed on a second side of the second substrate opposite from the first side, and
wherein the material is placed within the aperture of the second substrate and/or on a second side of the membrane opposite from the first side.

16. The method according to claim 15, wherein the first beam source is arranged on a first side of the first substrate opposite from the second substrate or on the second side of the membrane.

17. The method of claim 15, wherein the membrane is a silicon nitride membrane.

18. The method of claim 1, wherein the first high-intensity energy beam is a laser beam.

* * * * *